United States Patent
Parthasarathy et al.

(10) Patent No.: US 11,195,909 B2
(45) Date of Patent: Dec. 7, 2021

(54) LDMOS TRANSISTORS WITH BREAKDOWN VOLTAGE CLAMPS

(71) Applicant: Maxim Integrated Products, Inc., San Jose, CA (US)

(72) Inventors: Vijay Parthasarathy, Sunnyvale, CA (US); Vipindas Pala, San Jose, CA (US); Marco A. Zuniga, Berkeley, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 23 days.

(21) Appl. No.: 16/279,335

(22) Filed: Feb. 19, 2019

(65) Prior Publication Data

US 2019/0259830 A1 Aug. 22, 2019

Related U.S. Application Data

(60) Provisional application No. 62/632,726, filed on Feb. 20, 2018.

(51) Int. Cl.
*H01L 29/06* (2006.01)
*H01L 29/10* (2006.01)
*H01L 29/40* (2006.01)
*H01L 29/78* (2006.01)
*H02M 3/158* (2006.01)

(52) U.S. Cl.
CPC ...... *H01L 29/0634* (2013.01); *H01L 29/0653* (2013.01); *H01L 29/1095* (2013.01); *H01L 29/404* (2013.01); *H01L 29/7816* (2013.01); *H01L 29/7819* (2013.01); *H02M 3/158* (2013.01)

(58) Field of Classification Search
CPC ............. H01L 29/0634; H01L 29/7816; H01L 29/063; H01L 29/66698; H02M 3/158
See application file for complete search history.

(56) References Cited

U.S. PATENT DOCUMENTS

2010/0096697 A1* 4/2010 Su ..................... H01L 29/0692
257/343
2017/0263759 A1* 9/2017 Chung ................ H01L 29/0634

* cited by examiner

*Primary Examiner* — Quoc D Hoang
(74) *Attorney, Agent, or Firm* — Lathrop GPM LLP

(57) ABSTRACT

A lateral double-diffused metal-oxide-semiconductor (LDMOS) transistor including a breakdown voltage clamp includes a drain n+ region, a source n+ region, a gate, and a p-type reduced surface field (PRSF) layer including one or more bridge portions. Each of the one or more bridge portions extends below the drain n+ region in a thickness direction. Another LDMOS transistor includes a drain n+ region, a source n+ region, a gate, an n-type reduced surface field (NRSF) layer disposed between the source n+ region and the drain n+ region in a lateral direction, a PRSF layer disposed below the NRSF layer in a thickness direction orthogonal to the lateral direction, and a p-type buried layer (PBL) disposed below the PRSF layer in the thickness direction. The drain n+ region is disposed over the PBL in the thickness direction.

14 Claims, 17 Drawing Sheets

LDMOS TRANSISTORS WITH BREAKDOWN VOLTAGE CLAMPS

RELATED APPLICATIONS

This Application claims benefit of priority to U.S. Provisional Patent Application Ser. No. 62/632,726, filed on Feb. 20, 2018, which is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is supported within the transistors' semiconductor material primarily in a lateral direction. LDMOS transistors are often combined with other circuitry in integrated circuits, especially in power applications or radio-frequency applications.

FIG. 1 is a cross-sectional view of a prior art n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a gate conductive layer 117, and a gate dielectric layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage VDS is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage VDS, thereby enabling LDMOS transistor 100 to support a relatively large value of VDS without breakdown.

A positive voltage $V_{GS}$ applied between gate electrode 116 and source electrode 104 creates negative charges in silicon semiconductor structure 102 under gate dielectric layer 118, causing a minority-carrier channel to form in a region 136 of p-body 126. This channel has excess electrons and will therefore conduct current. Consequentially, current will flow in the lateral 138 direction through silicon semiconductor structure 102 from drain n+ region 132 to source n+ region 130 when $V_{GS}$ exceeds a threshold value and $V_{DS}$ is a positive value.

DETAILED DESCRIPTION OF THE EMBODIMENTS

LDMOS transistors are commonly used in switching power converters, such as in buck converters, boost converters, and buck-boost converters. Energy is lost during the switching process, i.e., while an LDMOS transistor is turning on or off. Therefore, it is desirable to minimize LDMOS transistor switching time to minimize energy loss in switching power converters.

LDMOS transistor switching time can be decreased by reducing LDMOS transistor threshold voltage. Accordingly, LDMOS transistors are now being designed with reduced-thickness gate dielectric layers to decrease transistor threshold voltage. For example, some modern LDMOS transistors have a sufficiently thin gate dielectric layer to enable the transistors to operate with a two-volt gate drive. However, such transistors are prone to failure from exposure to transient high-voltage spikes. Such high-voltage spikes are common in switching power converters, especially in high-voltage, high-current applications, due to interaction between high slew-rate current and parasitic inductance and capacitance.

Figure 1:
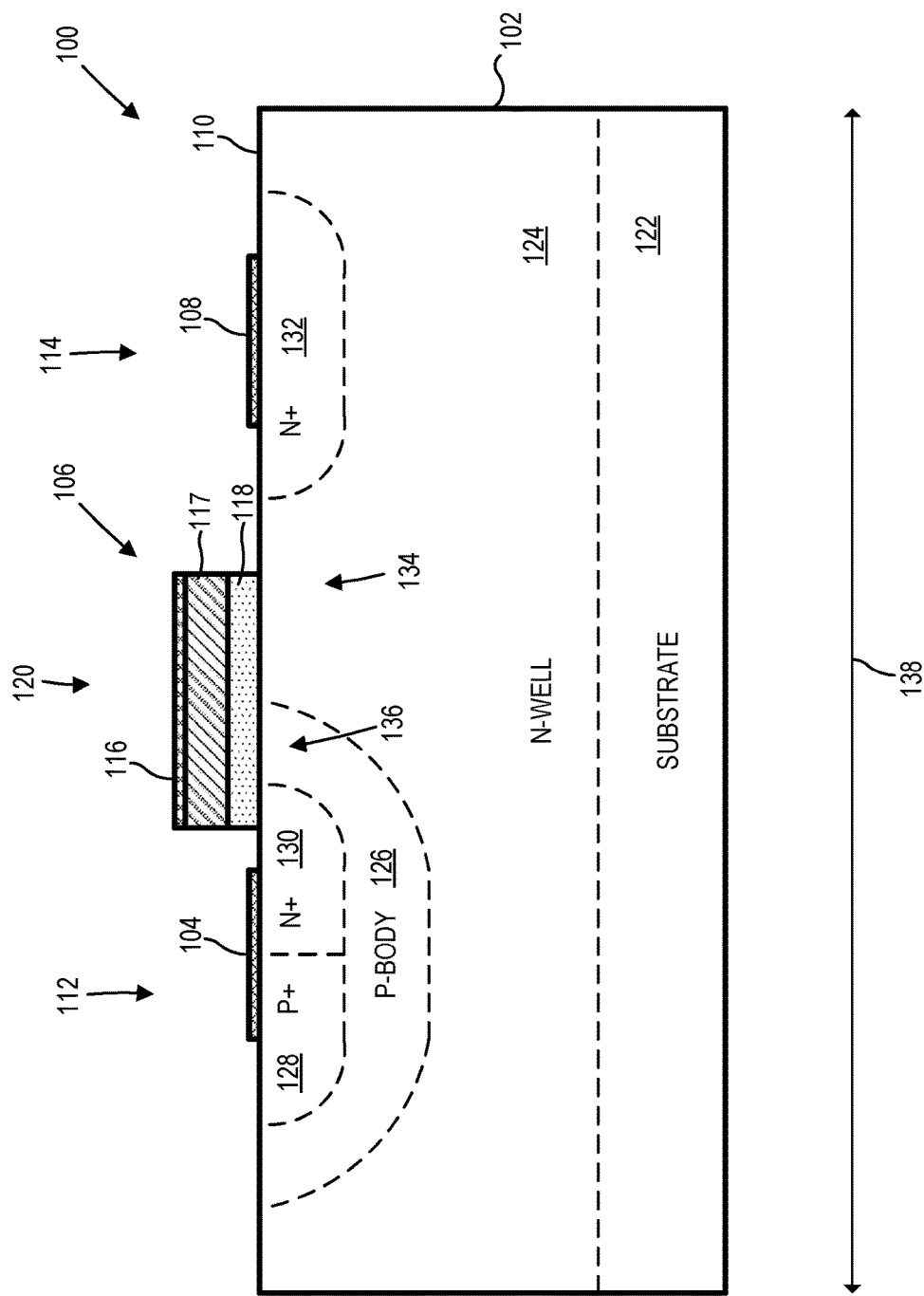
FIG. 1 is a cross-sectional view of a prior-art LDMOS transistor.
Figure 2:
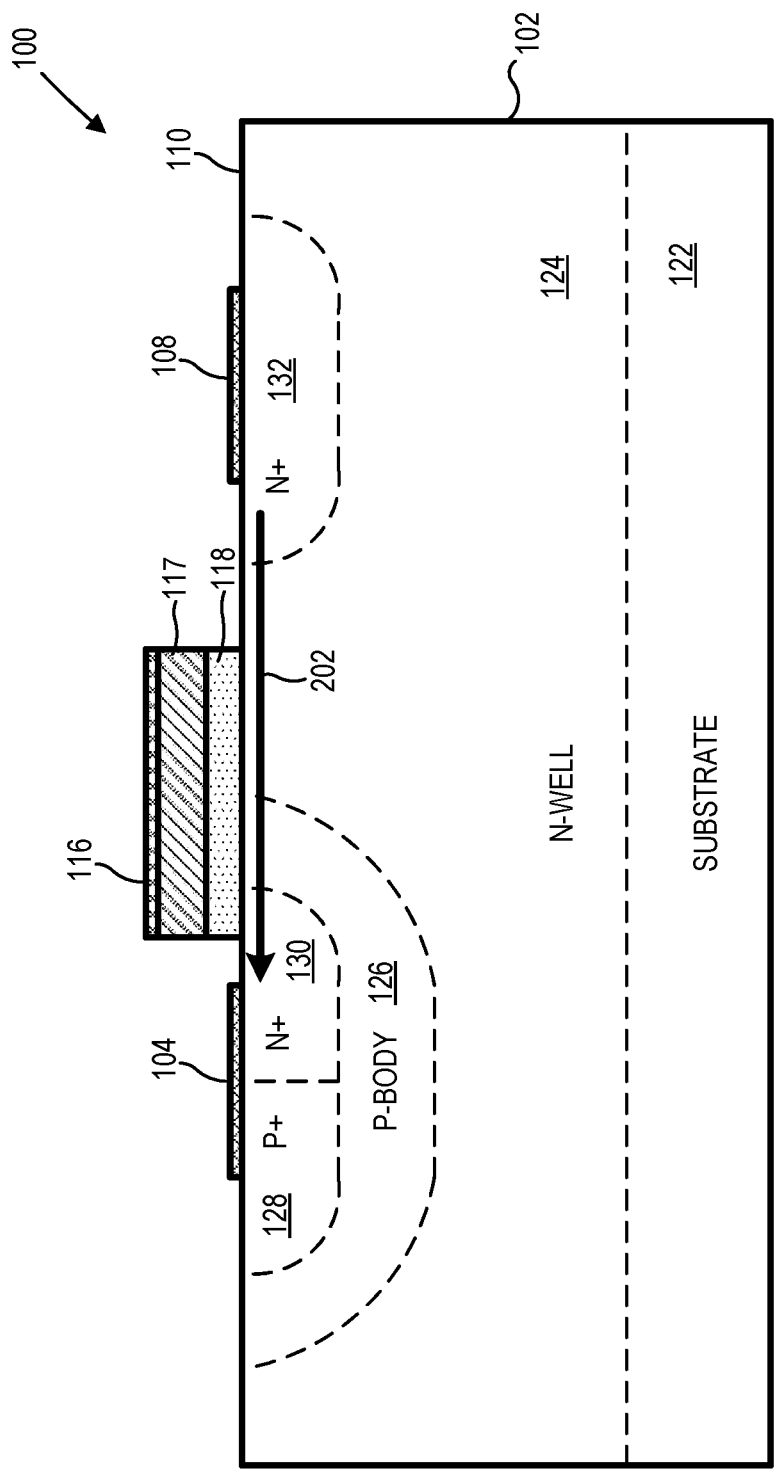
FIG. 2 is a cross-sectional view of the FIG. 1 LDMOS transistor illustrating flow of avalanched-induced hole current.

For instance, a transient high-voltage spike at a LDMOS transistor's drain creates a high electric field in the transistor which generates electron-hole pairs through impact ionization, and these electron-hole pairs may multiply through avalanche multiplication. Consequently, avalanche-induced hole current may flow through the transistor near the gate dielectric layer. For example, FIG. 2 is a cross-sectional view of LDMOS transistor 100 of FIG. 1 with avalanched-induced hole current illustrated by an arrow 202. Holes from the avalanche-induced hole current may flow into gate dielectric layer 118 and change the dielectric layer's properties, thereby degrading transistor performance. For instance, avalanche-induced hole current may change LDMOS transistor 100's threshold voltage and/or increase its on-resistance. Additionally, long-term exposure to avalanche-induced hole current may causes gate dielectric layer 118 to fail. Such failure of gate dielectric layer 118 may be referred to as time-dependent dielectric breakdown (TDDB).

Applicant has developed LDMOS transistors with breakdown voltage clamps which route avalanche-induced hole current away from the gate dielectric layer. Consequently, certain embodiments of these transistors are significantly less prone to TDDB than conventional LDMOS transistors.

Figure 3:
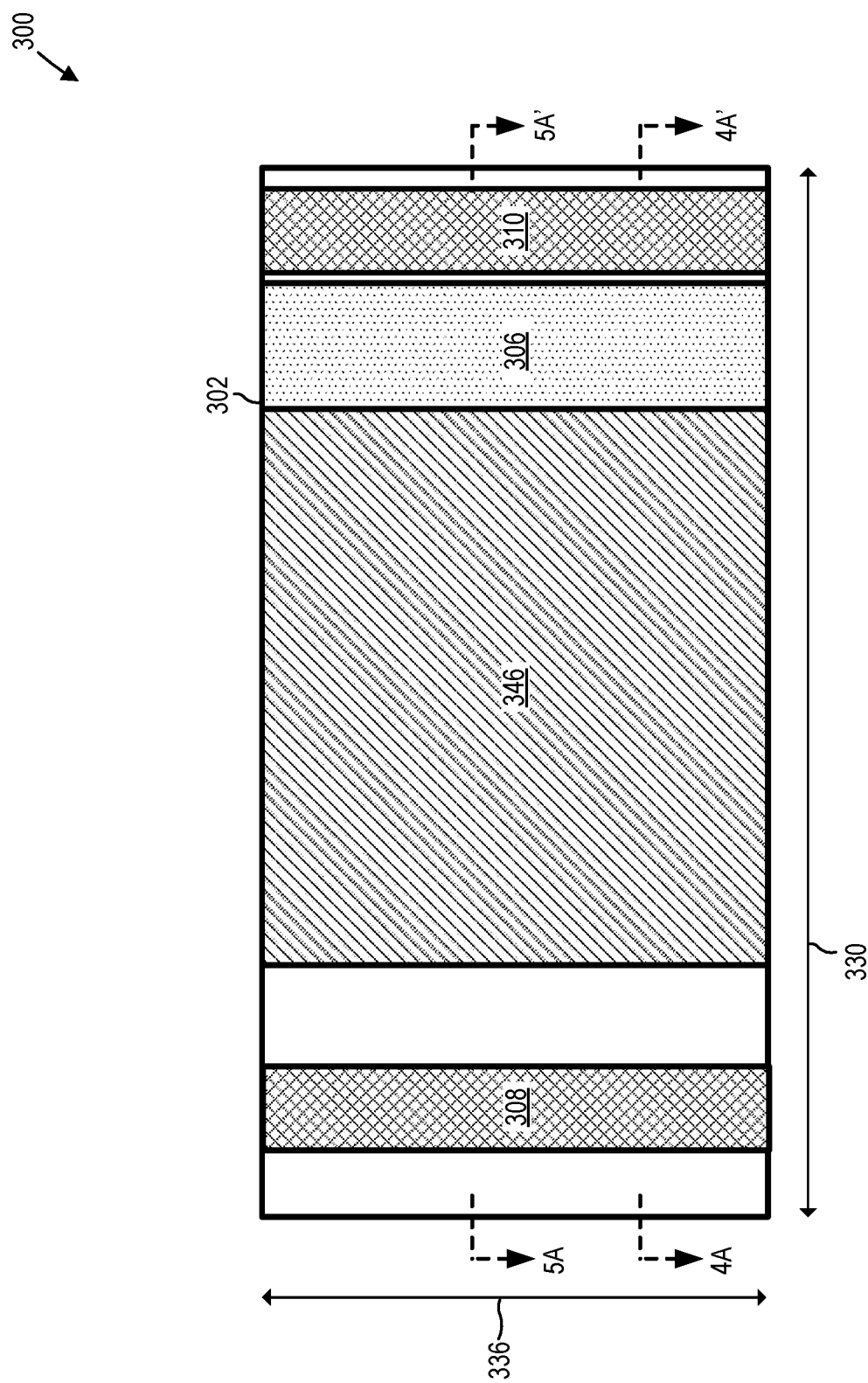
FIG. 3 is a top plan view of a LDMOS transistor including a breakdown voltage clamp, according to an embodiment.
Figure 4:
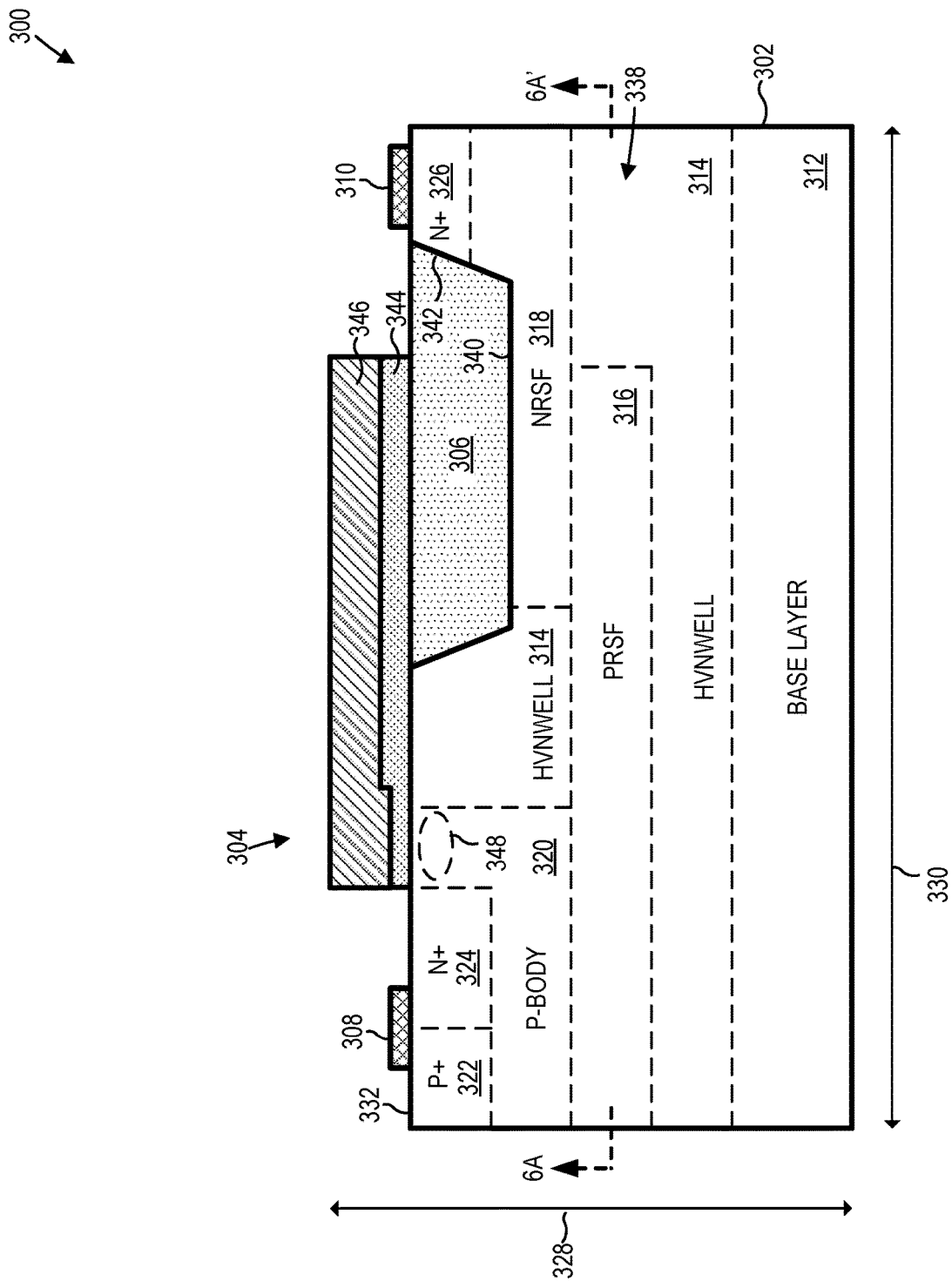
FIG. 4 is a cross-sectional view of the FIG. 3 LDMOS transistor taken along line 4A-4A' of FIG. 3.
Figure 5:
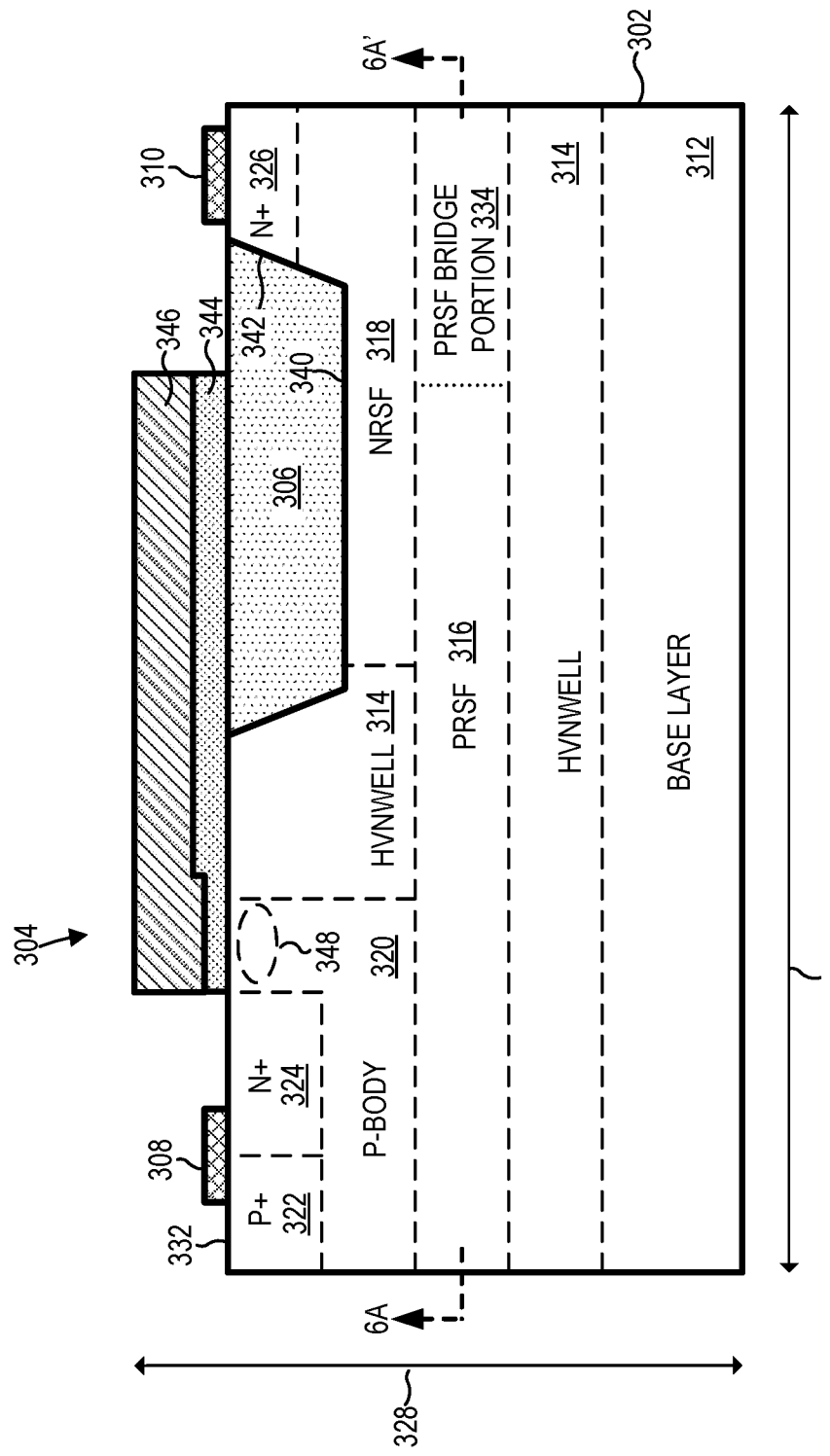
FIG. 5 is a cross-sectional view of the FIG. 3 LDMOS transistor taken along line 5A-5A' of FIG. 3.

FIG. 3 is a top plan view of a LDMOS transistor 300, which is one of the new LDMOS transistors including a breakdown voltage clamp. FIG. 4 is a cross-sectional view of LDMOS transistor 300 taken along line 4A-4A' of FIG. 3, and FIG. 5 is a cross-sectional view of LDMOS transistor 300 taken along line 5A-5A' of FIG. 3. LDMOS transistor 300 includes a silicon semiconductor structure 302, a gate 304, an isolation region 306, a source electrode 308, and a drain electrode 310.

Silicon semiconductor structure 302 includes a base layer 312, a high-voltage n-type well (HVNWELL) 314, p-type reduced surface field (PRSF) layer 316, an n-type reduced surface field (NRSF) layer 318, a p-body region 320, a source p+ region 322, a source n+ region 324, and a drain n+ region 326. Base layer 312 is, for example, a p-type silicon substrate or a p-type epitaxial layer. HVNWELL 314 is disposed over base layer 312 in a thickness direction 328, and PRSF layer 316 and p-body region 320 are each disposed in HVNWELL 314. NRSF layer 318 is disposed between PRSF layer 316 and isolation region 306 in the thickness 328 direction, and NRSF layer 318 is separated from p-body region 320 in a lateral 330 direction by a portion of HVNWELL 314, where the lateral 330 direction is orthogonal the thickness 328 direction. P-body region 320 is adjacent to an outer surface 332 of silicon semiconductor structure 302, and source p+ region 322 and source n+ region 324 are each disposed in p-body region 320. Drain n+ region 326 is disposed in NRSF 318 adjacent to outer surface 332, and drain n+ region 326 is separated from p-body region 320 in the lateral 330 direction. Source p+ region 322 has a greater p-type dopant concentration than each of p-body region 320 and PRSF layer 316, and p-body region 320 has a greater p-type dopant concentration than PRSF layer 316. Each of source n+ region 324 and drain n+ region 326 has a greater n-type dopant concentration than each of NRSF layer 318 and HVNWELL 314. NRSF layer 318 has a greater n-type dopant concentration than HVNWELL 314. The shape and size of the various regions of silicon semiconductor structure 302 can vary without departing from the scope hereof. For example, although the various regions of silicon semiconductor structure 302 are illustrated as having rectangular shapes for illustrative simplicity, the regions will have a rounded or irregular shape in many embodiments.

Figure 6:
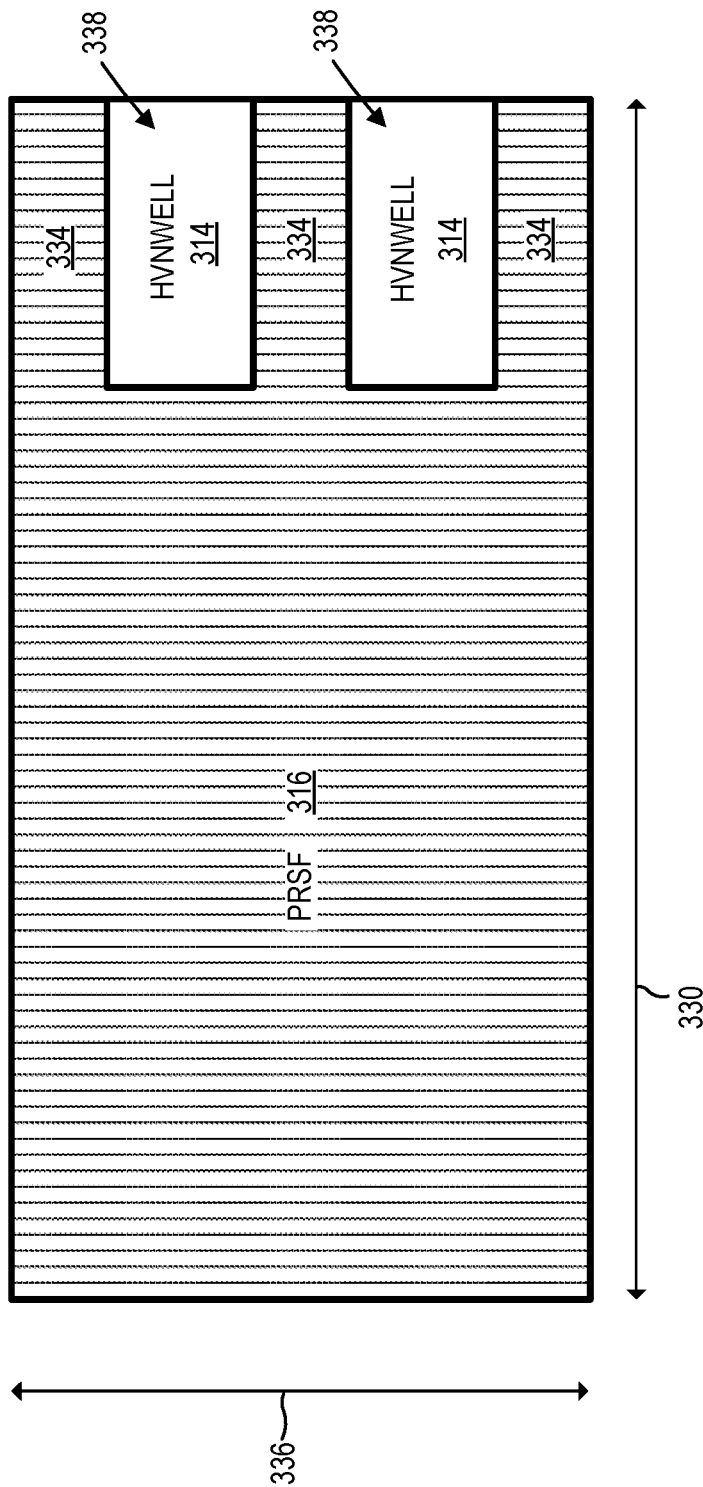
FIG. 6 is a cross-sectional view of the FIG. 3 LDMOS transistor taken along line 6A-6A' of FIGS. 4 and 5.

FIG. 6 is a cross-sectional view of LDMOS transistor 300 taken along line 6A-6A' of FIGS. 4 and 5. As visible in FIG. 6, PRSF layer 316 includes a plurality of bridge portions 334 separated from each other in a depth 336 direction to form openings 338 in PRSF layer 316, where the depth 336 direction is orthogonal to each of the thickness direction 328 and the lateral 330 direction. Each bridge portion 334 extends under drain n+ region 326 in the thickness 328 direction. Portions of HVNWELL 314 extend through openings 338 in PRSF layer 316 to contact NRSF layer 318, as shown in the FIG. 4 cross-section. Consequentially, portions of drain n+ region 326 disposed above openings 338 are non-overlapping with PRSF layer 316, as seen when LDMOS transistor 300 is viewed cross-sectionally in the thickness 328 direction. As discussed below, this configuration of PRSF layer 316 forms part of a breakdown voltage clamp while providing a connection between NRSF 318 and HVNWELL 314. Additionally, p-type PRSF layer 316 helps ensure that a depletion region extends through the entirety of a drift region between p-body region 320 and drain n+ region 326 in the lateral 330 direction during LDMOS transistor 300 operation. The depletion region's extension through the drift region promotes uniform electric field within the drift region, thereby enabling the drift region to be relatively highly doped without sacrificing breakdown voltage of LDMOS transistor 300. PRSF layer 316 could be modified to have fewer or additional bridge portions 334 without departing from the scope hereof, as long as PRSF layer 316 includes at least one bridge portion 334.

Isolation region 306 is at least partially recessed in silicon semiconductor structure 302. In some embodiments, isolation region 306 is a shallow trench isolation (STI) region formed by depositing a dielectric material in a trench 340 of silicon semiconductor structure 302. In some other embodiments, isolation region 306 is a LOCOS region. Isolation region 306 is disposed between p-body region 320 and drain n+ region 326 in the lateral 330 direction. Isolation region 306 at least partially defines a lateral edge 342 of drain n+ region 326.

Silicon semiconductor structure 302 may include additional impurity regions without departing from the scope hereof. Additionally, the locations of source p+ region 322 and source n+ region 324 within p-body region 320 can be varied. For example, in an alternate embodiment (not illustrated), source p+ region 322 is disposed behind source n+ region 324 in the depth direction 336 within p-body region 320. Furthermore, one or more regions of silicon semiconductor structure 302 optionally have a graded dopant concentration.

Source electrode 308 contacts each of source p+ region 322 and source n+ region 324, and drain electrode 310 contacts drain n+ region 326. The size, shape, and/or quantity of source electrode 308 and drain electrodes 310 may be varied without departing from the scope hereof. In some alternate embodiments, source electrode 308 is replaced with two separate electrodes contacting source p+ region 322 and source n+ region 324, respectively.

Gate 304 includes a gate dielectric layer 344 and a gate conductive layer 346 stacked over silicon semiconductor substrate 302 in the thickness 328 direction. In some embodiments, gate dielectric layer 344 is stepped such that a portion of gate dielectric layer 344 close to p-body region 320 is thinner than a portion of gate dielectric 344 further from p-body region 320. Gate dielectric layer 344 is formed, for example, of silicon dioxide or a high-K dielectric material such as one or more of $HfO_2$, $TiO_2$, $ZrO_2$, and $HfAlO_x$. Gate conductive layer 346 is formed, for example, of polysilicon or metal.

When positive voltage $V_{DS}$ is applied across drain electrode 310 and source electrode 308, a p-n junction formed at the interface of HVNWELL 314 and p-body region 320 is reversed biased, so that very little current flows between drain electrode 310 and source electrode 308 by default. However, a positive voltage $V_{GS}$ applied between gate conductive layer 346 and source electrode 308 creates negative charges in silicon semiconductor structure 302 under gate dielectric layer 344, causing a minority-carrier channel to form in a region 348 of p-body region 320. This channel has excess electrons and therefore conducts electric current through p-body region 320 from HVNWELL 314 to source n+ region 324. Consequentially, current will flow predominately in the lateral 330 direction through silicon semiconductor structure 302 from drain n+ region 326 to source n+ region 324 when $V_{GS}$ exceeds a threshold value and $V_{DS}$ is a positive value. The threshold value is established, in part, by the dopant concentration in p-body region 320 and by the thickness of gate dielectric layer 344 over p-body region 320. For example, threshold voltage can be reduced by decreasing p-type dopant concentration in p-body region 320 adjacent to gate 304 and/or by decreasing thickness of gate dielectric layer 344. Source p+ region 322 forms an ohmic contact between p-body region 320 and source electrode 322 to help prevent a parasitic bipolar junction transistor (not shown) in silicon semiconductor substrate 302 from activating.

Figure 7:
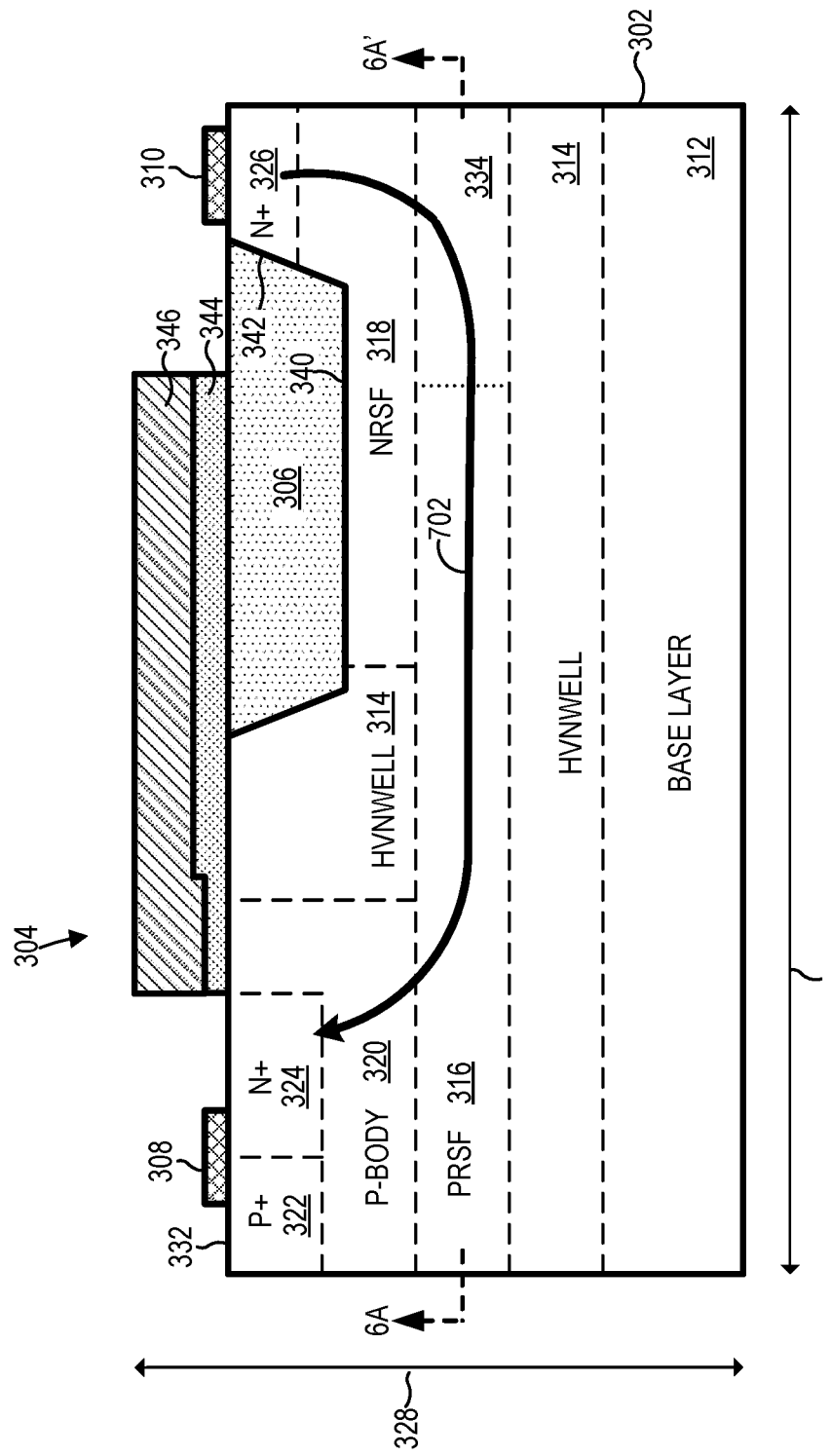
FIG. 7 is cross-sectional view of the FIG. 3 LDMOS transistor illustrating flow of avalanche-induced hole current.

Bridge portions 334 of PRSF and drain n+ region 326 collectively form a breakdown voltage clamp which routes avalanche-induced hole current away from gate dielectric layer 344. In particular, silicon semiconductor structure 302 is doped such that a breakdown voltage between drain n+ region 326 and bridge portions 334 of PRSF layer 316 is lower than a breakdown voltage between drain n+ region 326 and source n+ region 324. Consequently, avalanche-induced hole current predominately flows from drain n+ region 326 through PRSF layer 316 and away from gate dielectric layer 344, thereby helping prevent TDDB of gate dielectric layer 344, which promotes longevity of LDMOS transistor 300. FIG. 7 is cross-sectional view of LDMOS transistor 300 like that of the FIG. 5 but including an arrow 702 illustrating approximate flow of avalanche-induced hole current. Openings 338 electrically couple drain n+ region 326 to HVNWELL 314 to help ensure that drain n+ region 326 and HVNWELL 314 are at a common electrical potential, to help achieve high breakdown voltage of LDMOS transistor 300.

Figure 8:
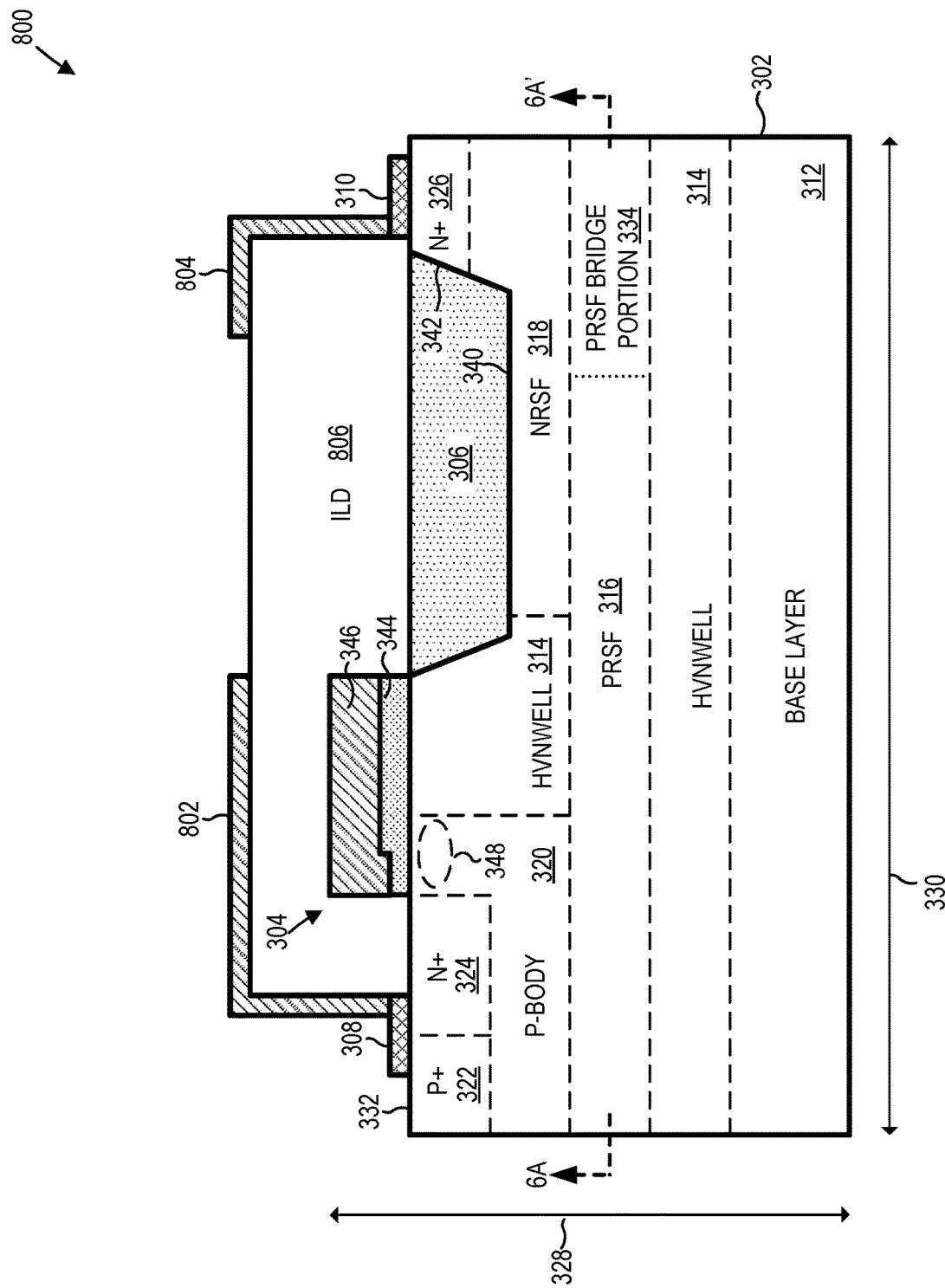
FIG. 8 is a cross-sectional view of a LDMOS transistor which is like the FIG. 3 LDMOS transistor, but where an isolation region is separated from a gate conductive layer in a lateral direction, according to an embodiment.

The configuration of LDMOS transistor 300 can be varied without departing from the scope hereof. For example, LDMOS transistor 300 can further includes spacer regions (not shown) around gate 304. As another example, FIG. 8 is a cross-sectional view of a LDMOS transistor 800, which is like LDMOS transistor 300, but where isolation region 306 is separated from gate conductive layer 346 in the lateral 330 direction. LDMOS transistor 800 further includes a first conductive field plate 802, a second conductive field plate 804, and an inner-layer dielectric (ILD) 806. First and second conductive field plates 802 and 804 are separated from silicon semiconductor structure 302 in the thickness 328 direction by ILD 806. First conductive field plate 802 is electrically coupled to source electrode 308, and second conductive field plate 804 is electrically coupled to drain electrode 310. The lateral separation of isolation region 306 from gate conductive layer 346 promotes tolerance of LDMOS transistor 800 to any cone defects which might be present in isolation region 306.

Figure 9:
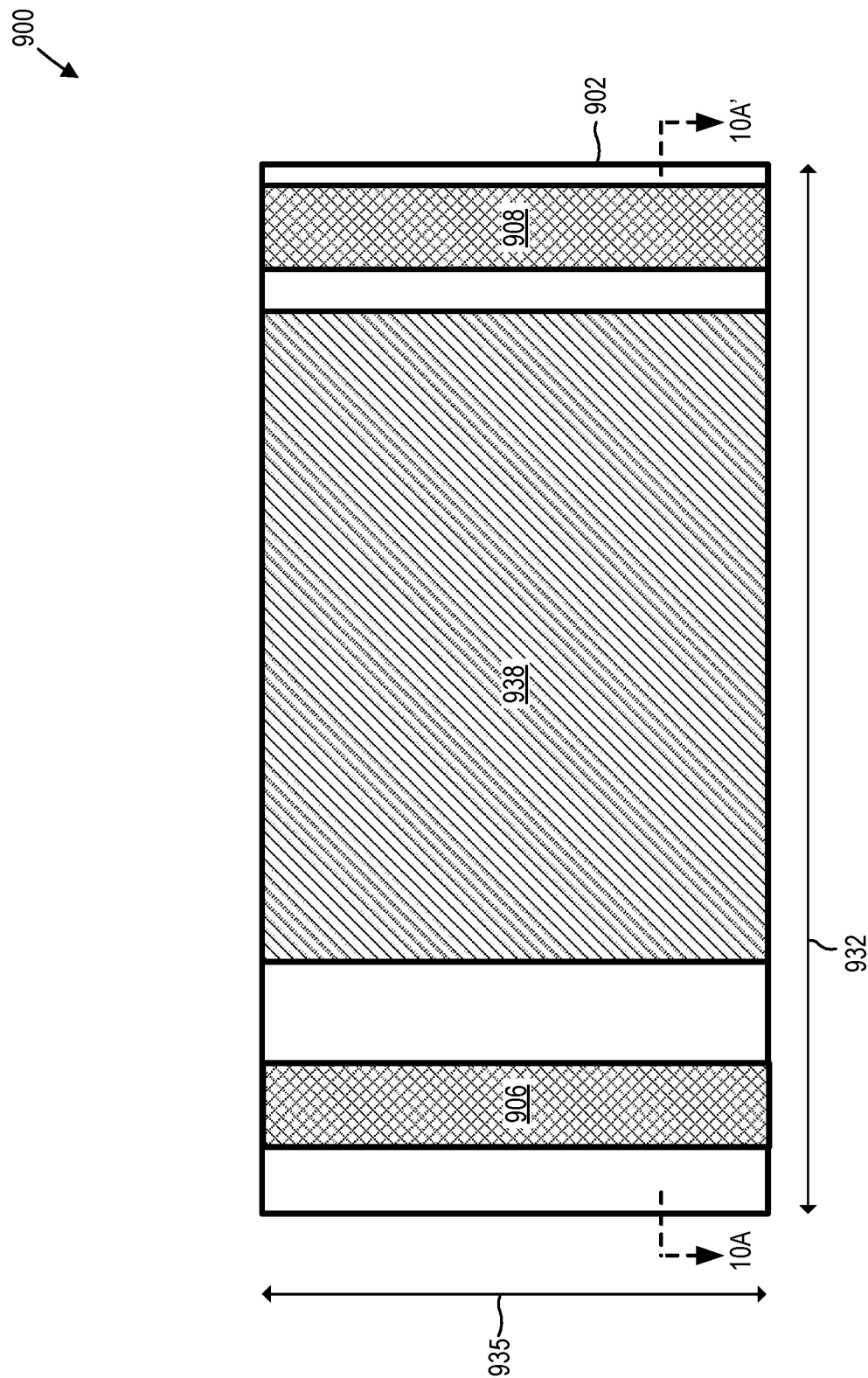
FIG. 9 is a top plan view of another LDMOS transistor including a breakdown voltage clamp, according to an embodiment.
Figure 10:
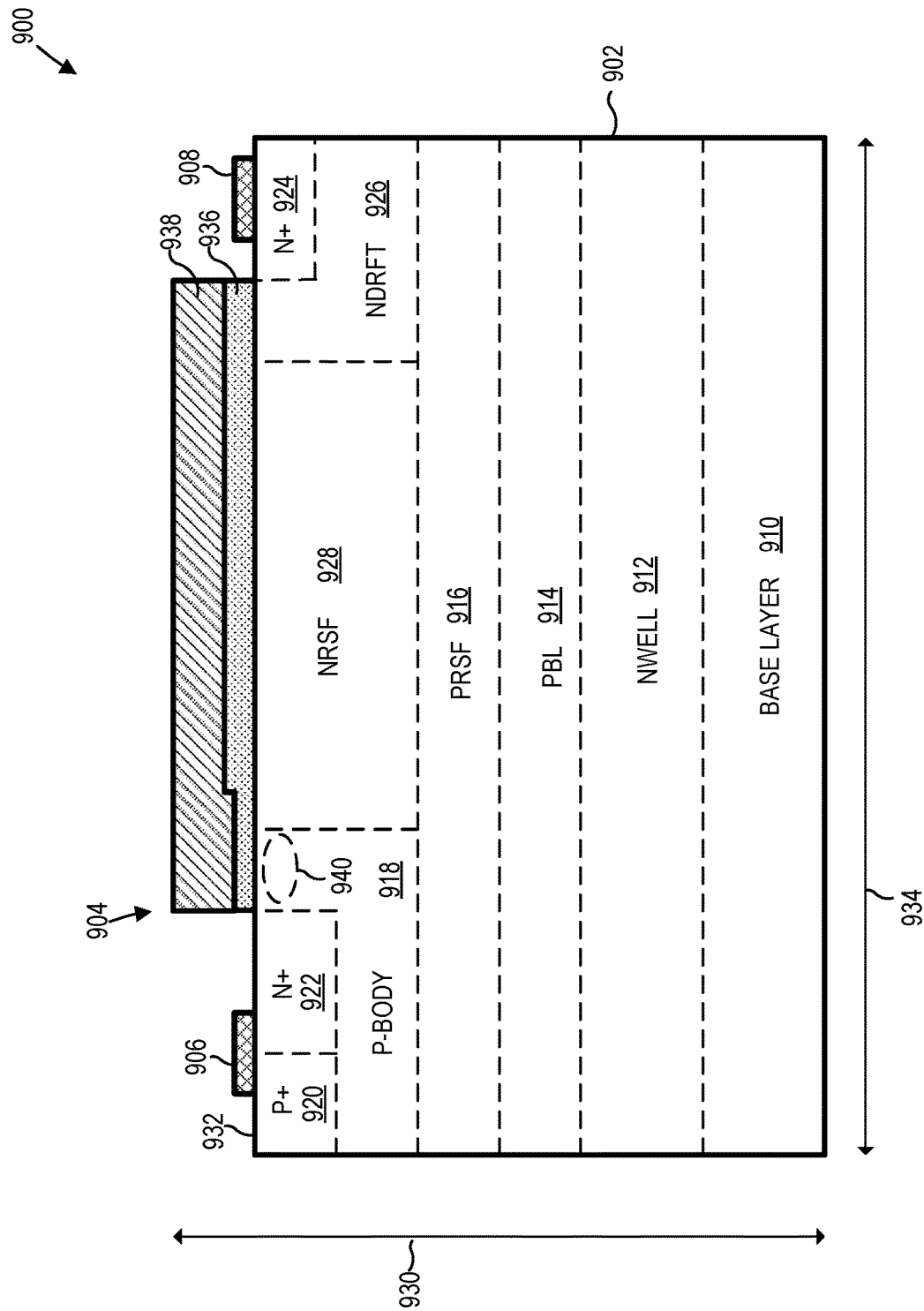
FIG. 10 is a cross-sectional view of the FIG. 9 LDMOS transistor taken along line 10A-10A' of FIG. 9.

FIG. 9 is a top plan view of a LDMOS transistor 900, which is one of the new LDMOS transistors including a breakdown voltage clamp. FIG. 10 is a cross-sectional view of LDMOS transistor 900 taken along line 10A-10A' of FIG. 9. LDMOS transistor 900 includes a silicon semiconductor structure 902, a gate 904, a source electrode 906, and a drain electrode 908.

Silicon semiconductor structure 902 includes a base layer 910, an n-type well (NWELL) layer 912, a p-type buried layer (PBL) 914, a p-type reduced surface field (PRSF) layer 916, a p-body region 918, a source p+ region 920, a source n+ region 922, a drain n+ region 924, an n-type drift (NDRFT) region 926, and an n-type reduced surface field (NRSF) layer 928. Base layer 910 is, for example, a p-type silicon substrate or a p-type epitaxial layer. NWELL layer 912 is disposed over base layer 910 in a thickness 930 direction, and PBL 914 is disposed over NWELL layer 912 in the thickness 930 direction. PRSF layer 916 is disposed over PBL 914 in the thickness 930 direction, and p-body region 918 is disposed over PRSF 916 in the thickness 930 direction adjacent to an outer surface 932 of silicon semiconductor structure 902. Source p+ region 920 and source n+ region 922 are each disposed in p-body region 918, and NDRFT region 926 is disposed over PRSF layer 916 in the thickness 930 direction. Drain n+ region 924 is disposed in NDRFT region adjacent to outer surface 932, and drain n+ region 924 is disposed over PBL 914 in the thickness 930 direction. NRSF layer 928 is disposed between p-body region 918 and drain n+ region 924 in a lateral 934 direction orthogonal to the thickness 930 direction.

Source p+ region 920 has a greater p-type dopant concentration than each of p-body region 918 and PRSF layer 916, and p-body region 918 has a greater p-type dopant concentration than PRSF 916. PBL 914 has a greater p-type dopant concentration than PRSF layer 916. Each of source n+ region 922 and drain n+ region 924 has a greater n-type dopant concentration than each of NRSF layer 928 and NWELL 912. NDRFT region 926 has a greater n-type dopant concentration than NRSF layer 928. The shape and size of the various regions of silicon semiconductor structure 902 can vary without departing from the scope hereof. For example, although the various regions of silicon semiconductor structure 902 are illustrated as having rectangular shapes for illustrative simplicity, the regions will have a rounded or irregular shape in many embodiments.

Silicon semiconductor structure 902 may include additional impurity regions without departing from the scope hereof. Additionally, the locations of source p+ region 920 and source n+ region 922 within p-body region 918 can be varied. For example, in an alternate embodiment (not illustrated), source p+ region 920 is disposed behind source n+ region 922 in a depth 935 direction within p-body region 918, where the depth 935 direction is orthogonal to each of the thickness 930 direction and the lateral 934 direction. Furthermore, one or more regions of silicon semiconductor structure 902 optionally have a graded dopant concentration.

Source electrode 906 contacts each of source p+ region 920 and source n+ region 922, and drain electrode 908 contacts drain n+ region 924. The size, shape, and/or quantity of source electrode 906 and drain electrode 908 may be varied without departing from the scope hereof. In some alternate embodiments, source electrode 906 is replaced with two separate electrodes contacting source p+ region 920 and source n+ region 922, respectively.

Gate 904 includes a gate dielectric layer 936 and a gate conductive layer 938 stacked over silicon semiconductor substrate 902 in the thickness 930 direction. In some embodiments, gate dielectric layer 936 is stepped such that a portion of gate dielectric layer 936 close to p-body region 918 is thinner than a portion of gate dielectric layer 936 further from p-body region 918. Gate dielectric layer 936 is formed, for example, of silicon dioxide or a high-K dielectric material such as one or more of $HfO_2$, $TiO_2$, $ZrO_2$, and $HfAlO_x$. Gate conductive layer 938 is formed, for example, of polysilicon or metal.

When positive voltage $V_{DS}$ is applied across drain electrode 908 and source electrode 906, a p-n junction formed at the interface of NRSF layer 928 and p-body region 918 is reversed biased, so that very little current flows between drain electrode 908 and source electrode 906 by default. However, a positive voltage $V_{GS}$ applied between gate conductive layer 938 and source electrode 906 creates negative charges in silicon semiconductor structure 902 under gate dielectric layer 936, causing a minority-carrier channel to form in a region 940 of p-body region 918. This channel has excess electrons and therefore conducts electric current through p-body region 918 from NRSF layer 928 to source n+ region 922. Consequentially, current will flow predominately in the lateral 934 direction through silicon semiconductor structure 902 from drain n+ region 924 to source n+ region 922 when $V_{GS}$ exceeds a threshold value and $V_{DS}$ is a positive value. The threshold value is established, in part, by the dopant concentration in p-body region 918 and by the thickness of gate dielectric layer 936 over p-body region 918. For example, threshold voltage can be reduced by decreasing p-type dopant concentration in p-body region 918 adjacent to gate 904 and/or by decreasing thickness of gate dielectric layer 936. Source p+ region 920 forms an ohmic contact between p-body region 918 and source electrode 906 to help prevent a parasitic bipolar junction transistor (not shown) in silicon semiconductor substrate 902 from activating.

Figure 11:
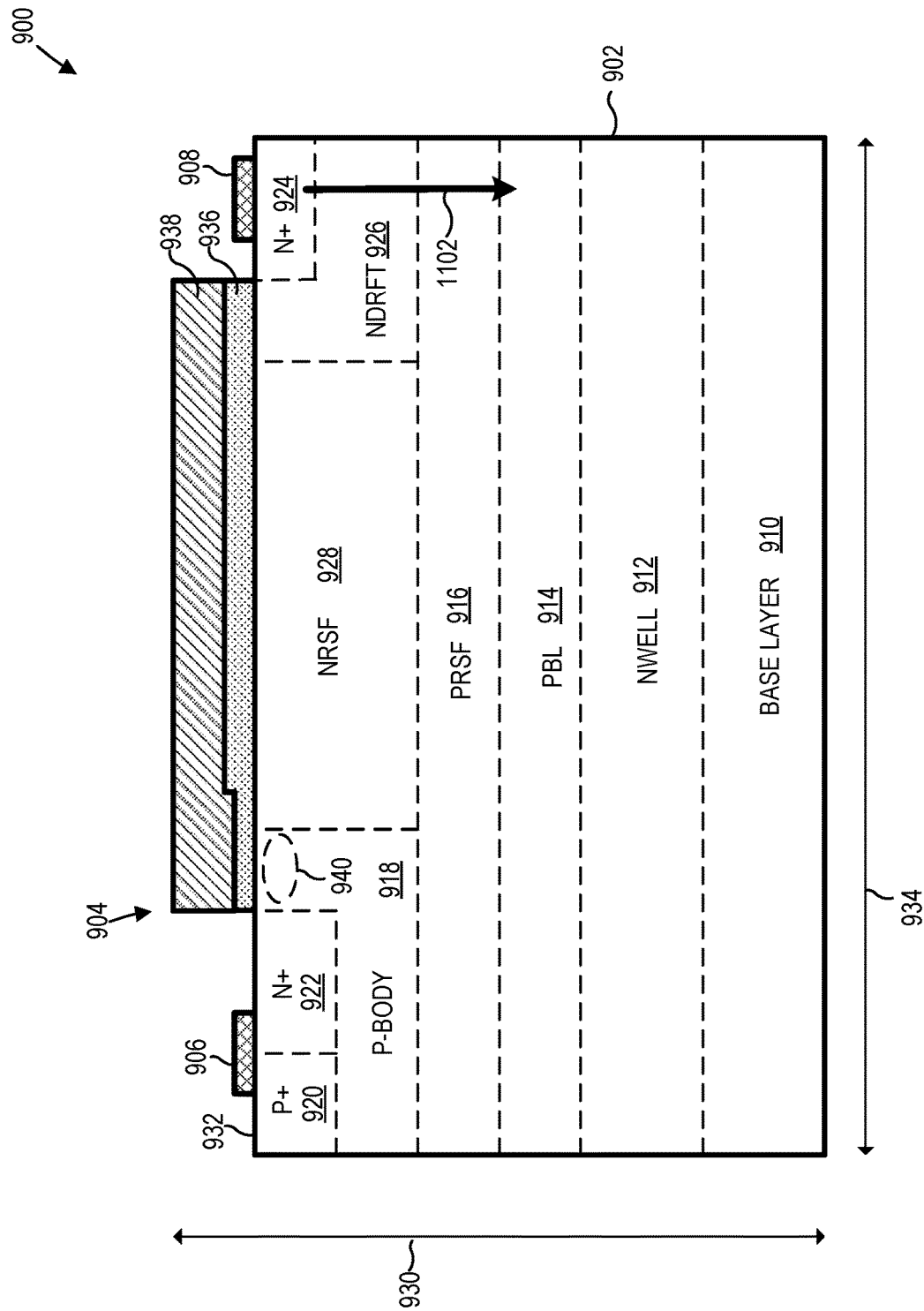
FIG. 11 is cross-sectional view of the FIG. 9 LDMOS transistor illustrating flow of avalanche-induced hole current.

PBL 914 and drain n+ region 924 collectively form a breakdown voltage clamp which routes avalanche-induced hole current away from gate dielectric layer 936. In particular, silicon semiconductor structure 902 is doped such that a breakdown voltage between drain n+ region 924 and PBL 914 is lower than a breakdown voltage between drain n+ region 924 and source n+ region 922. Consequently, avalanche-induced hole current predominately flows from drain n+ region 924 to PBL 914 and away from gate dielectric layer 936, thereby helping prevent TDDB of gate dielectric layer 936, which promotes longevity of LDMOS transistor 900. FIG. 11 is cross-sectional view of LDMOS transistor 900 with flow of avalanche-induced hole current approximately illustrated by an arrow 1102.

Figure 12:
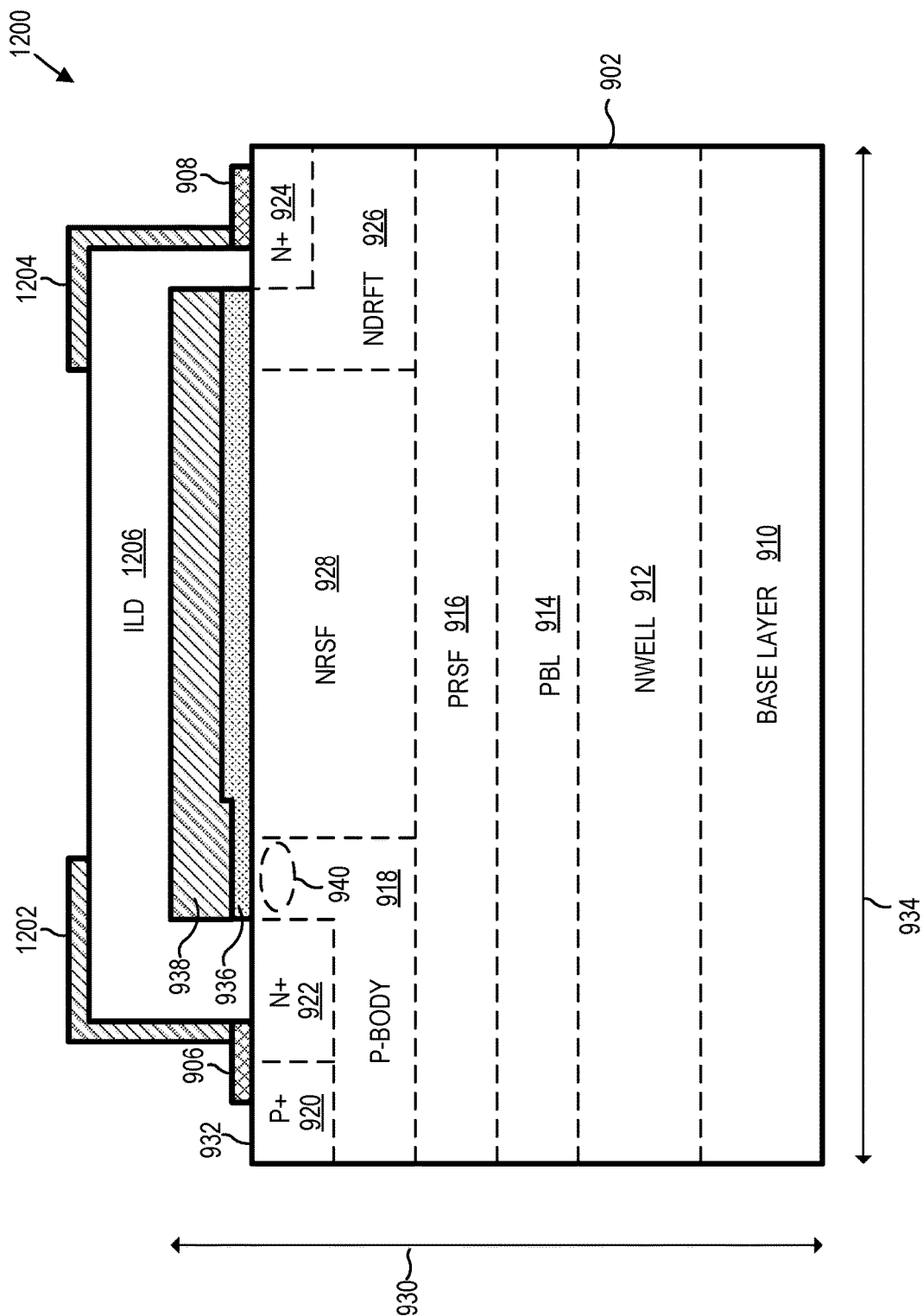
FIG. 12 is a cross-sectional view of a LDMOS transistor which is like the FIG. 9 LDMOS transistor but further including conductive field plates and an inner-layer dielectric, according to an embodiment.

The configuration of LDMOS transistor 900 can be varied without departing from the scope hereof. For example, LDMOS transistor 900 can further include spacer regions (not shown) around gate 904. As another example, FIG. 12 is a cross-sectional view of a LDMOS transistor 1200, which is like LDMOS transistor 900, but further including a first conductive field plate 1202, a second conductive field plate 1204, and an ILD 1206. First and second conductive field plates 1202 and 1204 are separated from silicon semiconductor structure 1202 in the thickness 930 direction by ILD 1206. First conductive field plate 1202 is electrically coupled to source electrode 906, and second conductive field plate 1204 is electrically coupled to drain electrode 908.

Figure 13:
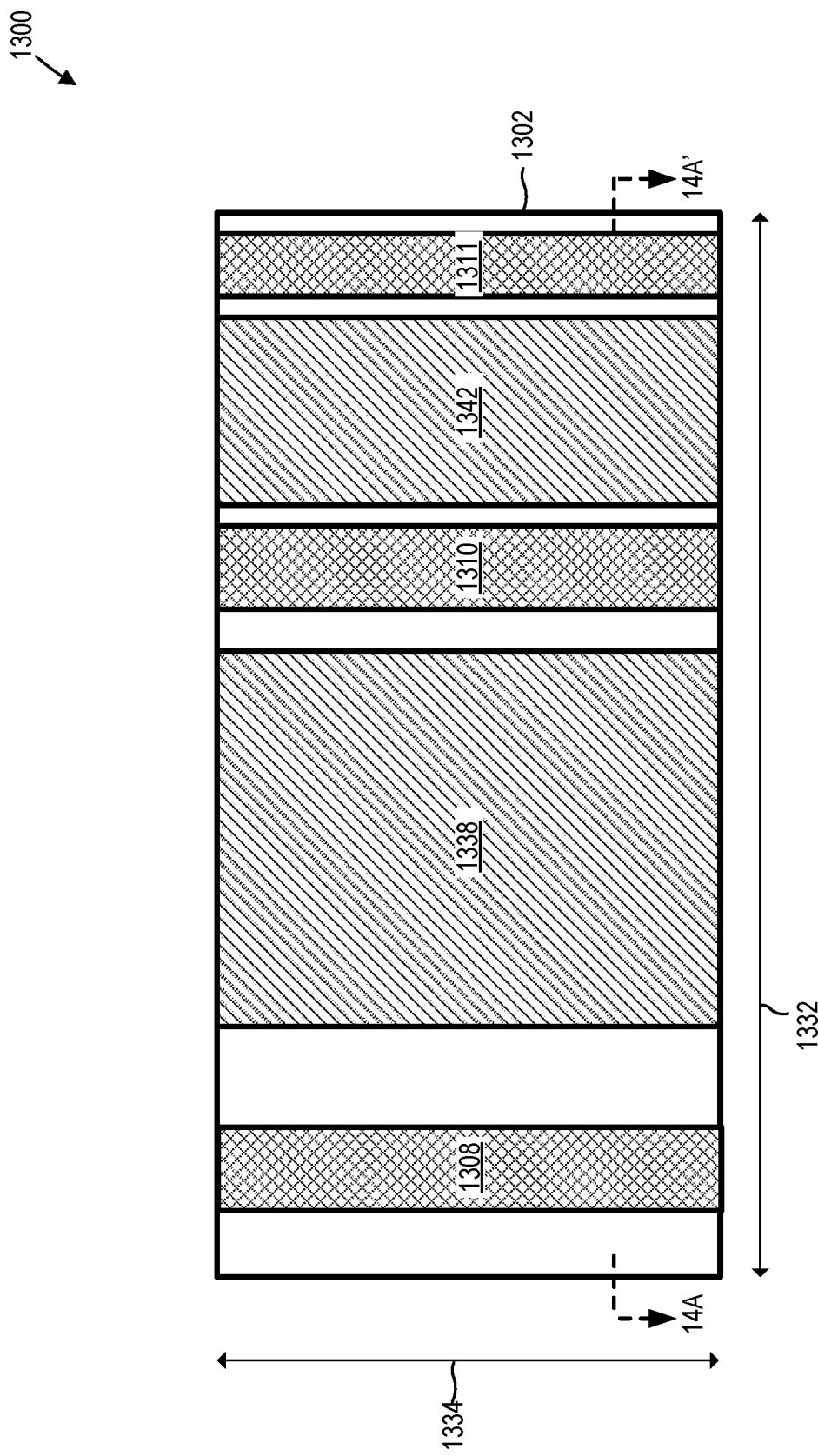
FIG. 13 is a top plan view of another LDMOS transistor including a breakdown voltage clamp, according to an embodiment.
Figure 14:
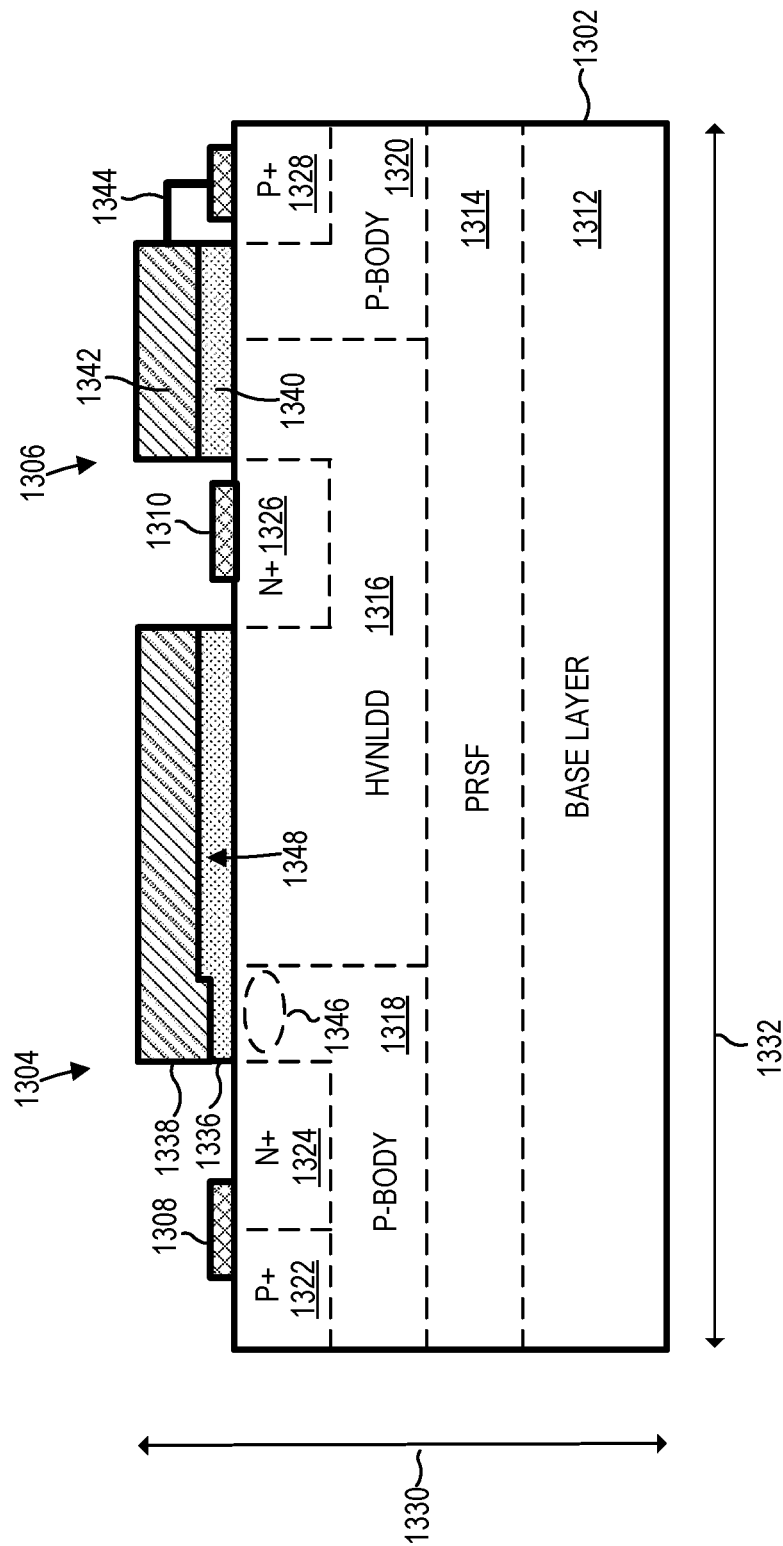
FIG. 14 is a cross-sectional view of the FIG. 13 LDMOS transistor taken along line 14A-14A' of FIG. 13.

FIG. 13 is a top plan view of a LDMOS transistor 1300, which is another of the new LDMOS transistors including a breakdown voltage clamp. FIG. 14 is a cross-sectional view of LDMOS transistor 1300 taken along line 14A-14A' of FIG. 13. LDMOS transistor 1300 includes a silicon semiconductor structure 1302, a first gate 1304, a second gate 1306, a source electrode 1308, a drain electrode 1310, and a diode electrode 1311.

Silicon semiconductor structure 1302 includes a base layer 1312, a p-type reduced surface field (PRSF) layer 1314, a high-voltage, an n-type laterally diffused drain (HVNLDD) 1316, a first p-body region 1318, a second p-body region 1320, a source p+ region 1322, a source n+ region 1324, a drain n+ region 1326, and a diode p+ region 1328. Base layer 1312 is, for example, a high-voltage, n-type well (HVNWELL) or a p-type substrate. PRSF layer 1314 is disposed over base layer 1312 in a thickness 1330 direction, and HVNLDD 1316 is disposed over PRSF layer 1314 in the thickness 1330 direction. Each of first and second p-body regions 1318 and 1320 is disposed over PRSF layer 1314 in the thickness 1330 direction such that HVNLDD 1316 separates first p-body region 1318 from second p-body region 1320 in a lateral direction 1332, where the lateral 1332 direction is orthogonal to the thickness 1330 direction. Source p+ region 1322 and source n+ region 1324 are each disposed in first p-body region 1318, and drain n+ region 1326 is disposed in HVNLDD 1316. Diode p+ region 1328 is disposed in second p-body region 1320.

Source p+ region 1322 has a greater p-type dopant concentration than each of first p-body region 1318, second p-body region 1320, and PRSF layer 1314. Each of first and second p-body regions 1318 and 1320 has a greater p-type dopant concentration than PRSF layer 1314. Each of source n+ region 1324 and drain n+ region 1326 has a greater n-type dopant concentration than HVNLDD 1316. The shape and size of the various regions of silicon semiconductor structure 1302 can vary without departing from the scope hereof. For example, although the various regions of silicon semiconductor structure 1302 are illustrated as having rectangular shapes for illustrative simplicity, the regions will have a rounded or irregular shape in many embodiments.

Silicon semiconductor structure 1302 may include additional impurity regions without departing from the scope hereof. Additionally, the locations of source p+ region 1322 and source n+ region 1324 within first p-body region 1318 can be varied. For example, in an alternate embodiment (not illustrated), source p+ region 1322 is disposed behind source n+ region 1324 in a depth 1334 direction within first p-body region 1318, where the depth 1334 direction is orthogonal to each of the thickness 1330 direction and the lateral 1332 direction. Furthermore, one or more regions of silicon semiconductor structure 1302 optionally have a graded dopant concentration.

Source electrode 1308 contacts each of source p+ region 1322 and source n+ region 1324. Drain electrode 1310 contacts drain n+ region 1326, and diode electrode 1311 contacts diode p+ region 1328. The size, shape, and/or quantity of source electrode 1308, drain electrode 1310, and diode electrode 1311 may be varied without departing from the scope hereof. In some alternate embodiments, source electrode 1308 is replaced with two separate electrodes contacting source p+ region 1322 and source n+ region 1324, respectively.

First gate 1304 includes a first gate dielectric layer 1336 and a first gate conductive layer 1338 stacked over silicon semiconductor substrate 1302 in the thickness 1330 direction. First gate 1304 extends at least partially over first p-body region 1318 and HVNLDD 1316 in the thickness 1330 direction. In some embodiments, first gate dielectric layer 1336 is stepped such that a portion of first gate dielectric layer 1336 close to first p-body region 1318 is thinner than a portion of first gate dielectric layer 1336 further from p-body region 1318. Second gate 1306 includes a second gate dielectric layer 1340 and a second gate conductive layer 1342 stacked over silicon semiconductor substrate 1302 in the thickness 1330 direction. Second gate 1306 extends at least partially over second p-body region 1320 and HVNLDD 1316 in the thickness 1330 direction. In some embodiments, diode p+ region 1328 is electrically coupled to second gate conductive layer 1342, such as by an electrical conductor 1344 and diode electrode 1311, as illustrated in FIG. 14.

Each of first and second gate dielectric layers 1336 and 1340 is formed, for example, of silicon dioxide or a high-K dielectric material such as one or more of $HfO_2$, $TiO_2$, $ZrO_2$, and $HfAlO_x$. Each of first and second gate conductive layers 1338 and 1342 is formed, for example, of polysilicon or metal. In certain embodiments, a high-voltage portion 1348 of first gate dielectric layer 1336 has the same thickness as second gate dielectric layer 1340 to promote ease of manufacturing of LDMOS transistor 1300. For example, configuring high-voltage portion 1348 of first gate dielectric layer 1336 to have the same thickness as second gate dielectric layer 1340 may enable high voltage portion 1348 and second gate dielectric layer 1340 to be formed by a common oxide module.

When positive voltage $V_{DS}$ is applied across drain electrode 1310 and source electrode 1308, a p-n junction formed at the interface of HVNLDD 1316 and first p-body region 1318 is reversed biased, so that very little current flows between drain electrode 1310 and source electrode 1308 by default. However, a positive voltage $V_{GS}$ applied between first gate conductive layer 1338 and source electrode 1308 creates negative charges in silicon semiconductor structure 1302 under first gate dielectric layer 1336, causing a minority-carrier channel to form in a region 1346 of first p-body region 1318. This channel has excess electrons and therefore conducts electric current through first p-body region 1318 from HVNLDD 1316 to source n+ region 1324. Consequentially, current will flow predominately in the lateral 1332 direction through silicon semiconductor structure 1302 from drain n+ region 1326 to source n+ region 1324 when $V_{GS}$ exceeds a threshold value and $V_{DS}$ is a positive value. The threshold value is established, in part, by the dopant concentration in first p-body region 1318 and by the thickness of gate dielectric layer 1336 over first p-body region 1318. For example, threshold voltage can be reduced by decreasing p-type dopant concentration in first p-body region 1318 adjacent to first gate 1304 and/or by decreasing thickness of gate dielectric layer 1336. Source p+ region 1322 forms an ohmic contact between first p-body region 1322 and source electrode 1308 to help prevent a parasitic bipolar junction transistor (not shown) in silicon semiconductor substrate 1302 from activating.

Figure 15:
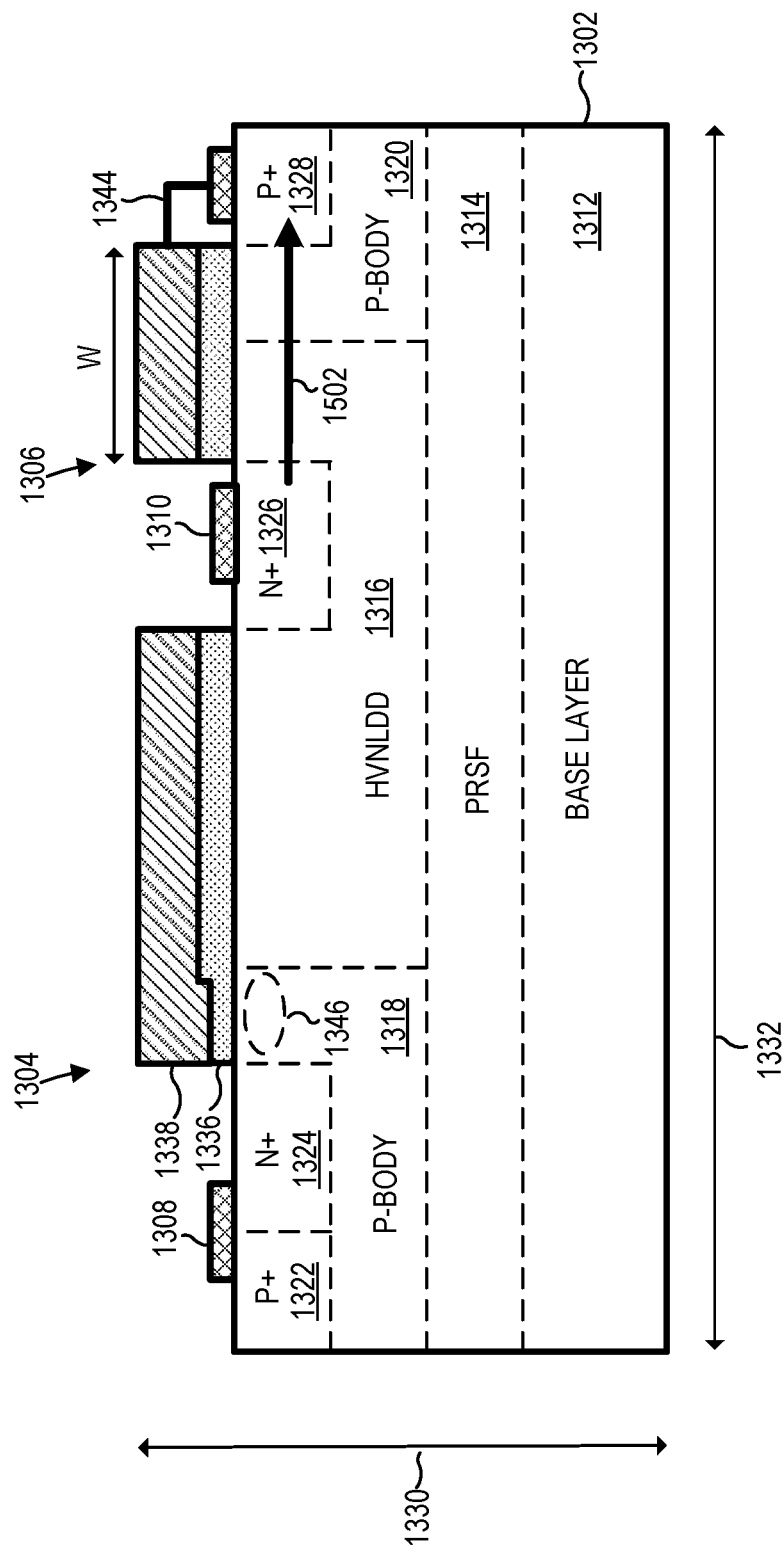
FIG. 15 is cross-sectional view of the FIG. 13 LDMOS transistor illustrating flow of avalanche-induced hole current.

Second p-body region 1320, HVNLDD 1316, diode p+ region 1328, and second gate 1306 collectively form a breakdown voltage clamp which routes avalanche-induced hole current away from first gate dielectric layer 1336. In particular, LDMOS transistor 1300 is configured such that a breakdown voltage between drain n+ region 1326 and second p-body region 1320 is lower than a breakdown voltage between drain n+ region 1326 and source n+ region 1324. Consequently, avalanche-induced hole current predominately flows from drain n+ region 1326 to diode p+ region 1328 and away from first gate dielectric layer 1336, thereby helping prevent TDDB of first gate dielectric layer 1336, which promotes longevity of LDMOS transistor 1300. FIG. 15 is cross-sectional view of LDMOS transistor 1300 with flow of avalanche-induced hole current approximately illustrated by an arrow 1502. Breakdown voltage of the breakdown voltage clamp generally increases with increasing width W of second gate 1306 (FIG. 15). Consequently, breakdown voltage of the breakdown voltage clamp can be tuned by varying width W of second gate 1306.

The configuration of LDMOS transistor 1300 can be varied without departing from the scope hereof. For example, LDMOS transistor 1300 can further include spacer regions (not shown) around first gate 1304 and/or second gate 1306. As another example, LDMOS transistor 1300 can further include conductive field plates and an ILD (not shown), such as similar to those illustrated in FIG. 8 or 12.

Figure 16:
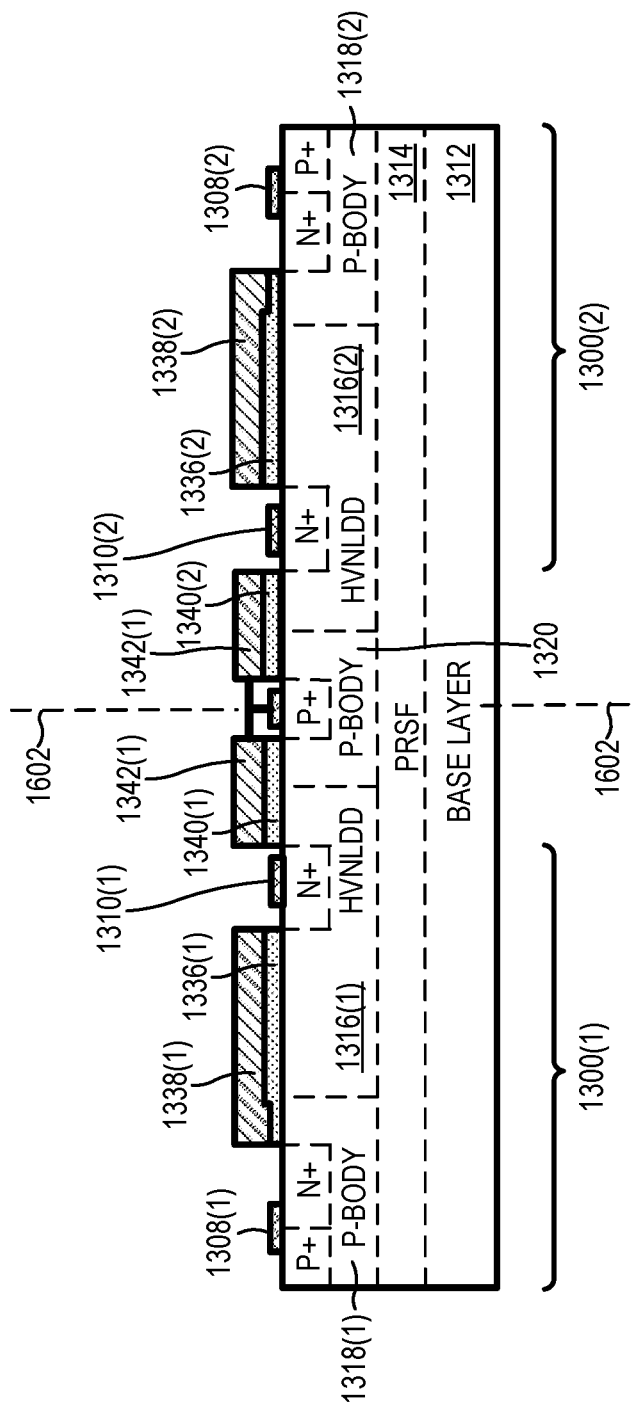
FIG. 16 is a cross-sectional view of two instances of the FIG. 13 LDMOS transistor sharing a common second p-body region, according to an embodiment.

Multiple instances of LDMOS transistor 1300 could be configured to share second p-body region 1320. For example, FIG. 16 is a cross-sectional view of two instances of LDMOS transistor 1300, referred to as LDMOS transistors 1300(1) and 1300(2), sharing a common second p-body region 1320. In this document, specific instances of an item may be referred to by use of a numeral in parentheses (e.g., LDMOS transistor 1300(1)), while numerals without parentheses refer to any such item (e.g., LDMOS transistors 1300). LDMOS transistor 1300(2) mirrors LDMOS transistor 1300(1) with respect to a center axis 1602. Some features of FIG. 16 are not labeled to promote illustrative clarity.

Figure 17:
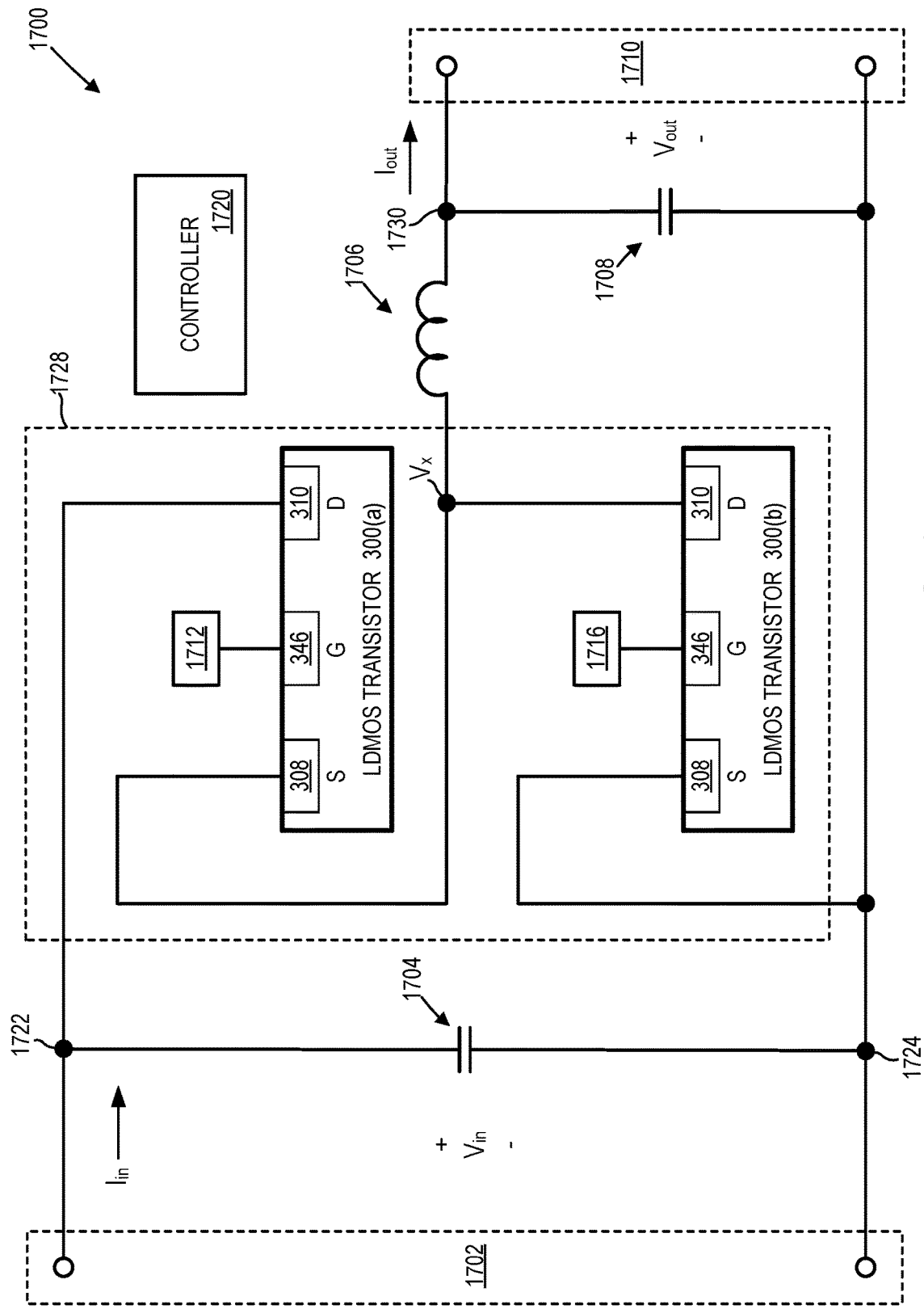
FIG. 17 schematically illustrates a buck converter including two instances of the FIG. 3 LDMOS transistor, according to an embodiment.

One possible application of the LDMOS transistors discussed above is in a switching power converter. For example, FIG. 17 schematically illustrates a buck converter 1700 including two instances of LDMOS transistor 300, hereinafter referred to as LDMOS transistor 300(a) and LDMOS transistor 300(b). LDMOS transistors 300(a) and 300(b) are schematically illustrated in FIG. 17 to promote illustrative clarity. LDMOS transistors 300(a) and 300(b) could be replaced with instances of LDMOS transistor 800, 900, 1200, or 1300 without departing from the scope hereof. Buck converter 1700 further includes an input port 1702 electrically coupled to an input power source (not shown), an input capacitor 1704, an inductor 1706, an output capacitor 1708, an output port 1710 electrically coupled to a load (not shown), first driver circuitry 1712, second driver circuitry 1716, and a controller 1720.

Input port 1702 is electrically coupled across a positive input node 1722 and a reference node 1724. Input capacitor 1704 is electrically coupled across positive input node 1722 and reference node 1724, and input capacitor 1704 provides a path for input ripple current drawn by buck converter 1700. Drain electrode 310 of LDMOS transistor 300(a) is electrically coupled to positive input node 1722, and source electrode 308 of LDMOS transistor 300(a) is electrically coupled to a switching node $V_x$. Gate conductive layer 346 is electrically coupled to first driver circuitry 1712. Drain electrode 310 of LDMOS transistor 300(b) is electrically coupled to switching node $V_x$, and source electrode 308 of LDMOS transistor 300(b) is electrically coupled to reference node 1724. Gate conductive layer 346 of LDMOS transistor 300(b) is electrically coupled to second driver circuitry 1716. LDMOS transistors 300(*a*) and 300(*b*), first driver circuitry 1712, and second driver circuitry 1716 collectively form a switching circuit 1728. Inductor 1706 is electrically coupled between switching node V$_x$ and a positive output node 1730, and output port 1710 is electrically coupled across positive output node 1730 and reference node 1724. Output capacitor 1708 is electrically coupled across positive output node 1730 and reference node 1724, and output capacitor 1708 provides a path for output ripple current generated by buck converter 1700.

Controller 1720 controls switching of switching circuit 1728 to transfer power from the power source (electrically coupled to input port 1702) to the load (electrically coupled to output port 1710). In particular, controller 1720 controls first driver circuitry 1712 to repeatedly switch gate conductive layer 346 of LDMOS transistor 300(*a*) between two different voltage magnitudes, to repeatedly create and destroy a minority-carrier channel in p-body region 320 of LDMOS transistor 300(*a*). Consequentially, LDMOS transistor 300(*a*) repeatedly switches between its conductive and non-conductive states under the control of controller 1720. Controller 1720 also controls second driver circuitry 1716 to repeatedly switch gate conductive layer 346 of LDMOS transistor 300(*b*) between two different voltage magnitudes to cause LDMOS transistor 300(*b*) to repeatedly switch between its conductive and non-conductive states. Controller 1720 controls switching of LDMOS transistor 300(*b*) such that it performs a freewheeling function, or in other words, such that LDMOS transistor 300(*b*) provides a path for current flowing through inductor 1706 when LDMOS transistor 300(*a*) is in its non-conductive state. In some embodiments, controller 1720 controls switching of switching circuit 1728 to regulate one or more parameters of buck converter 1300, such as input voltage V$_{in}$, input current I$_{in}$, input power P$_{in}$, output voltage V$_{out}$, output current I$_{out}$, and output power P$_{out}$. Connections between controller 1720 and other components of buck converter 1700 are not shown to promote illustrative clarity.

It should be appreciated that the LDMOS transistors discussed above are not limited to use in a buck converter, or even to use in a switching power converter. For example, LDMOS transistors 300, 800, 900, 1200, and 1300 could alternately be used in an amplifier.

Combinations of Features

Features described above may be combined in various ways without departing from the scope hereof. The following examples illustrate some possible combinations:

(A1) A lateral double-diffused metal-oxide-semiconductor (LDMOS) transistor including a breakdown voltage clamp may include (1) a drain n+ region, (2) a source n+ region, (3) a gate, and (4) a p-type reduced surface field (PRSF) layer including one or more bridge portions, each of the one or more bridge portions extending below the drain n+ region in a thickness direction.

(A2) In the LDMOS transistor denoted as (A1), a portion of the drain n+ region may be non-overlapping with the PRSF layer, as seen when the LDMOS transistor is viewed cross-sectionally in the thickness direction.

(A3) In any one of the LDMOS transistors denoted as (A1) and (A2), the one or more bridge portions may include a plurality of bridge portions, each of the plurality of bridge portions being separated from each other in a depth direction orthogonal to the thickness direction.

(A4) In any one of the LDMOS transistors denoted as (A1) through (A3), a breakdown voltage between the drain n+ region and the PRSF layer may be lower than a breakdown voltage between the drain n+ region and the source n+ region.

(A5) Any one of the LDMOS transistors denoted as (A1) through (A4) may further include a high-voltage, n-type well (HVNWELL), the PRSF layer being embedded in the HVNWELL.

(A6) The LDMOS transistor denoted as (A5) may further include an n-type reduced surface field (NRSF) layer disposed in the HVNWELL, where (1) the drain n+ region is disposed in the NRSF layer and (2) a portion of the HVNWELL extends through an opening in the PRSF layer to contact the NRSF layer in the thickness direction.

(A7) Any one of the LDMOS transistors denoted as (A5) and (A6) may further include (1) a p-body region and (2) a p+ source region disposed in the p-body region, where the source n+ region is also disposed in the p-body region.

(A8) The LDMOS transistor denoted as (A7) may further include an isolation region disposed between the p-body region and the drain n+ region in a lateral direction orthogonal to the thickness direction.

(B1) A lateral double-diffused metal-oxide-semiconductor (LDMOS) transistor including a breakdown voltage clamp may include a silicon semiconductor structure including (1) a base layer, (2) a high-voltage, n-type well (HVNWELL) disposed over the base layer in a thickness direction, (3) a p-type reduced surface field (PRSF) layer embedded in the HVNWELL, the PRSF layer including one or more bridge portions, (4) a p-body region disposed in the HVNWELL, (5) a source p+ region and a source n+ region each disposed in the p-body region, and (6) a drain n+ region disposed in the HVNWELL. The one or more bridge portions may extend under the drain n+ region in the thickness direction, and the drain n+ region may be separated from the p-body region in a lateral direction orthogonal to the thickness direction. The LDMOS transistor may further include (1) a gate including a gate dielectric layer and a gate conductive layer stacked over the silicon semiconductor structure in the thickness direction and (2) an isolation region at least partially recessed in the silicon semiconductor structure.

(B2) In the LDMOS transistor denoted as (B1), the silicon semiconductor structure may further include an n-type reduced surface field (NRSF) layer disposed in the HVNWELL. The drain n+ region may be disposed in the NRSF layer, and a portion of the HVNWELL may extend through an opening in the PRSF layer to contact the NRSF layer in the thickness direction.

(B3) In the LDMOS transistor denoted as (B2), the NRSF layer may be disposed over the PRSF layer in the thickness direction.

(B4) In any one of the LDMOS transistors denoted as (B2) and (B3), the NRSF layer may be separated from the p-body region in the lateral direction by a portion of the HVNWELL.

(B5) In any one of the LDMOS transistors denoted as (B1) through (B4), a portion of the drain n+ region may be non-overlapping with the PRSF layer, as seen when the LDMOS transistor is viewed cross-sectionally in the thickness direction.

(B6) In any one of the LDMOS transistors denoted as (B1) through (B5), the one or more bridge portions may include a plurality of bridge portions, each of the plurality of bridge portions being separated from each other in a depth direction, the depth direction being orthogonal to each of the thickness direction and the lateral direction.

(B7) In any one of the LDMOS transistors denoted as (B1) through (B6), a breakdown voltage between the drain n+ region and the PRSF layer may be lower than a breakdown voltage between the drain n+ region and the source n+ region.

(B8) In any one of the LDMOS transistors denoted as (B1) through (B7), the base layer may be selected from the group consisting of a p-type silicon substrate and a p-type epitaxial layer.

(B9) In any one of the LDMOS transistors denoted as (B1) through (B8), the source p+ region may have a greater p-type dopant concentration than the p-body region, and each of the source and drain n+ regions may have a greater n-type dopant concentration than the HVNWELL.

(B10) In any one of the LDMOS transistors denoted as (B1) through (B9), the gate dielectric layer may be formed of silicon dioxide.

(B11) In any one of the LDMOS transistors denoted as (B1) through (B9), the gate dielectric layer may be formed of one or more high-K dielectric materials.

(B12) In the LDMOS transistor denoted as (B11), the one or more high-K dielectric materials may include at least one of $HfO_2$, $TiO_2$, $ZrO_2$, and $HfAlO_x$.

(B13) In any one of the LDMOS transistors denoted as (B1) through (B12), the gate conductive layer may be formed of polysilicon.

(B14) In any one of the LDMOS transistors denoted as (B1) through (B13), the isolation region may be selected from the group consisting of a shallow trench isolation region and a local oxidation of silicon isolation region.

(C1) A lateral double-diffused metal-oxide-semiconductor (LDMOS) transistor including a breakdown voltage clamp may include (1) a drain n+ region, (2) a source n+ region, (3) a gate, (4) an n-type reduced surface field (NRSF) layer disposed between the source n+ region and the drain n+ region in a lateral direction, (5) a p-type reduced surface field (PRSF) layer disposed below the NRSF layer in a thickness direction orthogonal to the lateral direction, and (6) a p-type buried layer (PBL) disposed below the PRSF layer in the thickness direction, the drain n+ region being disposed over the PBL in the thickness direction.

(C2) In the LDMOS transistor denoted as (B1), a breakdown voltage between the drain n+ region and the PBL may be lower than a breakdown voltage between the drain n+ region and the source n+ region.

(C3) Any one of the LDMOS transistors denoted as (C1) and (C2) may further include an n-type drift (NDRFT) region disposed over the PRSF layer, where the drain n+ region is disposed in the NDRFT region.

(C4) Any one of the LDMOS transistors denoted as (C1) through (C3) may further include (1) a p-body region and (2) a p+ source region disposed in the p-body region, where the source n+ region is also disposed in the p-body region.

(D1) A lateral double-diffused metal-oxide-semiconductor (LDMOS) transistor including a breakdown voltage clamp may include a silicon semiconductor structure including (1) a base layer, (2) an n-type well (NWELL) layer disposed over the base layer in a thickness direction, (3) a p-type buried layer (PBL) disposed over the NWELL layer in the thickness direction, (4) a p-type reduced surface field (PRSF) layer disposed over the PBL in the thickness direction, (5) a p-body region disposed over the PRSF layer, (6) a source n+ region and a source p+ region each disposed in the p-body region, (7) a drain n+ region disposed over the PBL in the thickness direction, and (8) an n-type reduced surface field (NRSF) layer disposed between the p-body region and the drain n+ region in a lateral direction orthogonal to the thickness direction. The LDMOS transistor may further include a gate including a gate dielectric layer and a gate conductive layer stacked over the silicon semiconductor structure in the thickness direction.

(D2) In the LDMOS transistor denoted as (D1), a breakdown voltage between the drain n+ region and the PBL may be lower than a breakdown voltage between the drain n+ region and the source n+ region.

(D3) Any one of the LDMOS transistors denoted as (D1) and (D2) may further include an n-type drift (NDRFT) region disposed over the PRSF layer, where the drain n+ region is disposed in the NDRFT region.

(D4) In any one of the LDMOS transistors denoted as (D1) through (D3), the base layer may be selected from the group consisting of a p-type silicon substrate and a p-type epitaxial layer.

(D5) In any one of the LDMOS transistors denoted as (B1) through (B4), the source p+ region may have a greater p-type dopant concentration than the p-body region, and each of the source and drain n+ regions may have a greater n-type dopant concentration than the NWELL layer.

(D6) In any one of the LDMOS transistors denoted as (D1) through (D5), the gate dielectric layer may be formed of silicon dioxide.

(D7) In any one of the LDMOS transistors denoted as (D1) through (D5), the gate dielectric layer may be formed of one or more high-K dielectric materials.

(D8) In the LDMOS transistor denoted as (D7), the one or more high-K dielectric materials may include at least one of $HfO_2$, $TiO_2$, $ZrO_2$, and $HfAlO_x$.

(D9) In any one of the LDMOS transistors denoted as (D1) through (D8), the gate conductive layer may be formed of polysilicon.

(E1) A lateral double-diffused metal-oxide-semiconductor (LDMOS) transistor including a breakdown voltage clamp may include a silicon semiconductor structure including (1) a base layer, (2) a p-type reduced surface field (PRSF) layer disposed over the base layer in a thickness direction, (3) a high-voltage, n-type laterally diffused drain (HVNLDD) disposed over the PRSF layer in the thickness direction, and (4) a first and second p-body region each disposed over the PRSF layer in the thickness direction such that the HVNLDD separates the first p-body region from the second p-body region in a lateral direction orthogonal to the thickness direction. The LDMOS transistor may further include (1) a first gate including a first gate dielectric layer and a first gate conductive layer stacked over the silicon semiconductor structure in the thickness direction, the first gate extending at least partially over the first p-body region and the HVNLDD in the thickness direction, and (2) a second gate including a second gate dielectric layer and a second gate conductive layer stacked over the silicon semiconductor structure in the thickness direction, the second gate extending at least partially over the second p-body region and the HVNLDD in the thickness direction.

(E2) In the LDMOS transistor denoted as (E1), the silicon semiconductor structure may further include (1) a source n+ region disposed in the first p-body region, (2) a drain n+ region disposed in the HVNLDD, and (3) a diode p+ region disposed in the second p-body region and electrically coupled to the second gate conductive layer.

(E3) In any one of the LDMOS transistors denoted as (E1) and (E2), a breakdown voltage between the drain n+ region and the second p-body region may be lower than a breakdown voltage between the drain n+ region and the source n+ region.

(E4) In any one of the LDMOS transistors denoted as (E1) through (E3), the base may include one of a high-voltage, n-type well (HVNWELL) and a p-type substrate.

(E5) In any one of the LDMOS transistors denoted as (E1) through (E4), (1) the silicon semiconductor structure may further include a source p+ region disposed in the first p-body region, (2) the source p+ region may have a greater p-type dopant concentration than the first p-body region, and (3) each of the source and drain n+ regions may have a greater n-type dopant concentration than the HVNLDD.

(E6) In any one of the LDMOS transistors denoted as (E1) through (E5), each of the first and second gate dielectric layers may be formed of silicon dioxide.

(E7) In any one of the LDMOS transistors denoted as (E1) through (E5), each of the first and second gate dielectric layers may be formed of one or more high-K dielectric materials.

(E8) In the LDMOS transistor denoted as (E7), the one or more high-K dielectric materials may include at least one of $HfO_2$, $TiO_2$, $ZrO_2$, and $HfAlO_x$.

(E9) In any one of the LDMOS transistors denoted as (E1) through (E8), each of the first and second gate conductive layers may be formed of polysilicon.

Changes may be made in the above transistors, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present devices, methods, and systems, which, as a matter of language, might be said to fall therebetween.

What is claimed is:

1. A lateral double-diffused metal-oxide-semiconductor (LDMOS) transistor including a breakdown voltage clamp, comprising:
   a drain n+ region;
   a source n+ region;
   a gate;
   a p-type reduced surface field (PRSF) layer including at least one bridge portion extending below the drain n+ region along a thickness direction;
   a high-voltage, n-type well (HVNWELL), the PRSF layer being embedded in the HVNWELL;
   an n-type reduced surface field (NRSF) layer disposed in the HVNWELL, wherein:
   the drain n+ region is disposed in the NRSF layer; and
   a portion of the HVNWELL extending through an opening in the PRSF layer to contact the NRSF layer in the thickness direction.

2. The LDMOS transistor of claim 1, a portion of the drain n+ region non-overlapping with the PRSF layer, as seen when the LDMOS transistor is viewed cross-sectionally in the thickness direction.

3. The LDMOS transistor of claim 1, the one or more bridge portions including a plurality of bridge portions, each of the plurality of bridge portions being separated from each other in a depth direction orthogonal to the thickness direction.

4. The LDMOS transistor of claim 1, wherein a breakdown voltage between the drain n+ region and the PRSF layer is lower than a breakdown voltage between the drain n+ region and the source n+ region.

5. The LDMOS transistor of claim 1, further comprising:
   a p-body region; and
   a p+ source region disposed in the p-body region,
   wherein the source n+ region is also disposed in the p-body region.

6. The LDMOS transistor of claim 5, further comprising an isolation region disposed between the p-body region and the drain n+ region in a lateral direction orthogonal to the thickness direction.

7. A lateral double-diffused metal-oxide-semiconductor (LDMOS) transistor including a breakdown voltage clamp, comprising:
   a silicon semiconductor structure, including:
      a base layer,
      a high-voltage, n-type well (HVNWELL) disposed over the base layer in a thickness direction,
      a p-type reduced surface field (PRSF) layer embedded in the HVNWELL, the PRSF layer including one or more bridge portions,
      a p-body region disposed in the HVNWELL,
      a source p+ region and a source n+ region each disposed in the p-body region, and
      a drain n+ region disposed in the HVNWELL, the one or more bridge portions within the PRSF layer extending under the drain n+ region in the thickness direction, and the drain n+ region being separated from the p-body region in a lateral direction orthogonal to the thickness direction;
   a gate including a gate dielectric layer and a gate conductive layer stacked over the silicon semiconductor structure in the thickness direction;
   an isolation region at least partially recessed in the silicon semiconductor structure;
   an n-type reduced surface field (NRSF) layer disposed in the HVNWELL;
   the drain n+ region is disposed in the NRSF layer; and
   a portion of the HVNWELL extending through an opening in the PRSF layer to contact the NRSF layer in the thickness direction.

8. The LDMOS transistor of claim 7, wherein the NRSF layer is disposed over the PRSF layer in the thickness direction.

9. The LDMOS transistor of claim 7, wherein the NRSF layer is separated from the p-body region in the lateral direction by a portion of the HVNWELL.

10. The LDMOS transistor of claim 7, a portion of the drain n+ region non-overlapping with the PRSF layer, as seen when the LDMOS transistor is viewed cross-sectionally in the thickness direction.

11. The LDMOS transistor of claim 9, the one or more bridge portions including a plurality of bridge portions, each of the plurality of bridge portions being separated from each other in a depth direction, the depth direction being orthogonal to each of the thickness direction and the lateral direction.

12. The LDMOS transistor of claim 7, wherein a breakdown voltage between the drain n+ region and the PRSF layer is lower than a breakdown voltage between the drain n+ region and the source n+ region.

13. The LDMOS transistor of claim 7, wherein the base layer is selected from the group consisting of a p-type silicon substrate and a p-type epitaxial layer.

14. The LDMOS transistor of claim 7, wherein:
   the source p+ region has a greater p-type dopant concentration than the p-body region; and
   each of the source and drain n+ regions has a greater n-type dopant concentration than the HVNWELL.

* * * * *